(12) United States Patent
Noboru

(10) Patent No.: US 8,139,199 B2
(45) Date of Patent: Mar. 20, 2012

(54) EXPOSURE METHOD, EXPOSURE APPARATUS, LIGHT CONVERGING PATTERN FORMATION MEMBER, MASK, AND DEVICE MANUFACTURING METHOD

(75) Inventor: Michio Noboru, Kawasaki (JP)

(73) Assignee: Nikon Corporation, Tokyo (JP)

( * ) Notice: Subject to any disclaimer, the term of this patent is extended or adjusted under 35 U.S.C. 154(b) by 799 days.

(21) Appl. No.: 12/039,083

(22) Filed: Feb. 28, 2008

(65) Prior Publication Data

US 2008/0239266 A1 Oct. 2, 2008

Related U.S. Application Data

(60) Provisional application No. 60/907,444, filed on Apr. 2, 2007.

(51) Int. Cl.
*G03B 27/42* (2006.01)

(52) U.S. Cl. .................. 355/53; 355/55; 355/67; 355/72

(58) Field of Classification Search ..................... 355/53, 355/55, 67
See application file for complete search history.

(56) References Cited

U.S. PATENT DOCUMENTS

| | | | |
|---|---|---|---|
| 4,636,626 A | 1/1987 | Hazama et al. | |
| 4,790,632 A | 12/1988 | Miyakawa et al. | |
| 5,223,693 A | 6/1993 | Zumoto et al. | |
| 5,528,118 A | 6/1996 | Lee | |
| 6,255,130 B1 | 7/2001 | Kim | |
| 6,586,168 B1 | 7/2003 | Ohsaki | |
| 6,969,966 B2 | 11/2005 | Ebihara et al. | |
| 2001/0041306 A1 | 11/2001 | Cole et al. | |
| 2002/0140919 A1* | 10/2002 | Shiraishi et al. | 355/53 |
| 2004/0121245 A1* | 6/2004 | Inao et al. | 430/5 |
| 2005/0068467 A1 | 3/2005 | Bleeker et al. | |
| 2006/0158635 A1* | 7/2006 | Takada | 355/67 |
| 2006/0186355 A1 | 8/2006 | Smith et al. | |
| 2007/0048678 A1 | 3/2007 | Chen et al. | |
| 2007/0153249 A1 | 7/2007 | Troost et al. | |
| 2007/0258078 A1 | 11/2007 | Troost et al. | |

(Continued)

FOREIGN PATENT DOCUMENTS

CN 1455298 A 11/2003
WO WO 99-49504 9/1999

(Continued)

OTHER PUBLICATIONS

International Search Report and Written Opinion for International Application No. PCT/JP2008/056519 mailed Jul. 11, 2008.

(Continued)

*Primary Examiner* — Edward Glick
*Assistant Examiner* — Mesfin T Asfaw
(74) *Attorney, Agent, or Firm* — Finnegan, Henderson, Farabow, Garrett & Dunner, L.L.P.

(57) ABSTRACT

An exposure method includes a first exposure step of irradiating a mask, which is arranged near a plate, with exposure light and exposing a predetermined pattern formed on the mask onto a plate; and a second exposure step of irradiating a light converging pattern formation member, which is arranged near the plate and includes a plurality of light converging portions, with exposure light and exposing a light converging pattern having a predetermined shape onto the plate. At least part of the predetermined pattern exposed onto the plate in the first exposure step and at least part of the light converging pattern formed on the plate in the second exposure step overlap each other.

56 Claims, 32 Drawing Sheets

U.S. PATENT DOCUMENTS

2007/0296936 A1 12/2007 Kato et al.
2009/0009736 A1* 1/2009 Timmermans et al. ......... 355/53

FOREIGN PATENT DOCUMENTS

WO    WO 2006/080285    8/2006

OTHER PUBLICATIONS

Office Action in the State Intellectual Property Office of the People's Republic of China (SIPO) mailed Dec. 31, 2010, for Chinese Application No. 200880005543.5.

* cited by examiner

Fig. 1
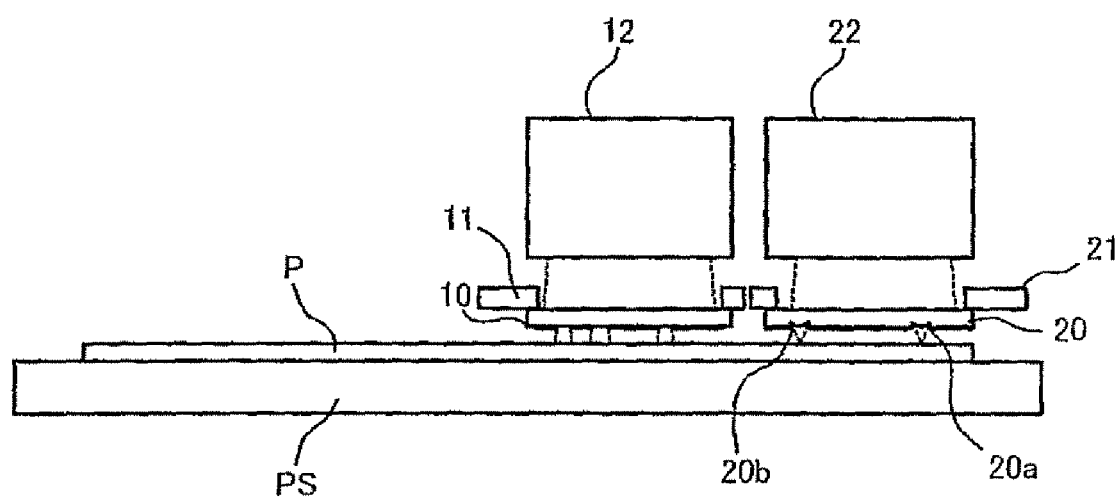
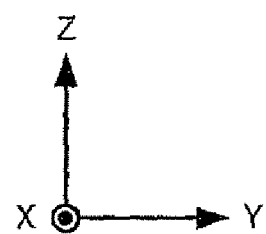

Fig. 3(a)
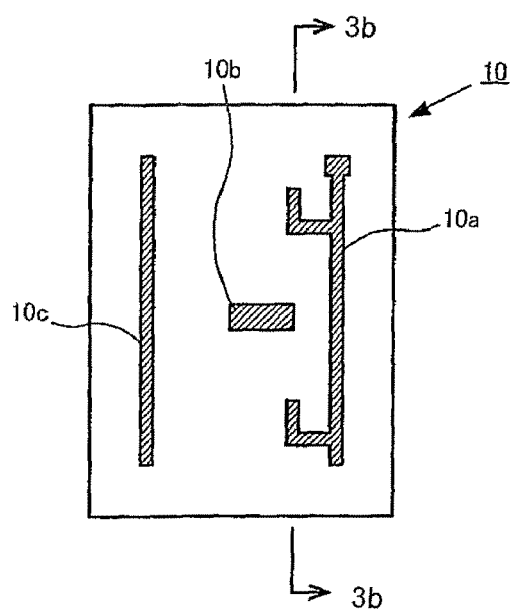
Fig. 3(c)
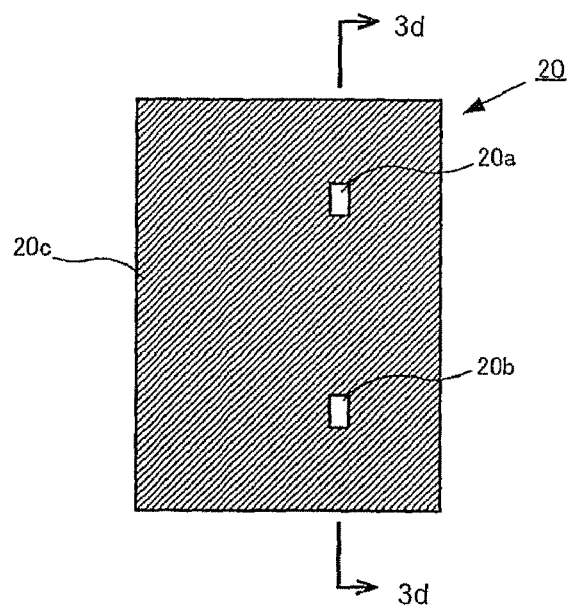
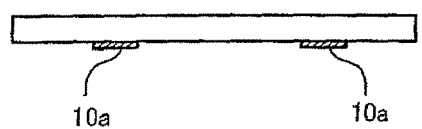
Fig. 3(b)
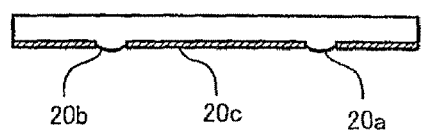
Fig. 3(d)

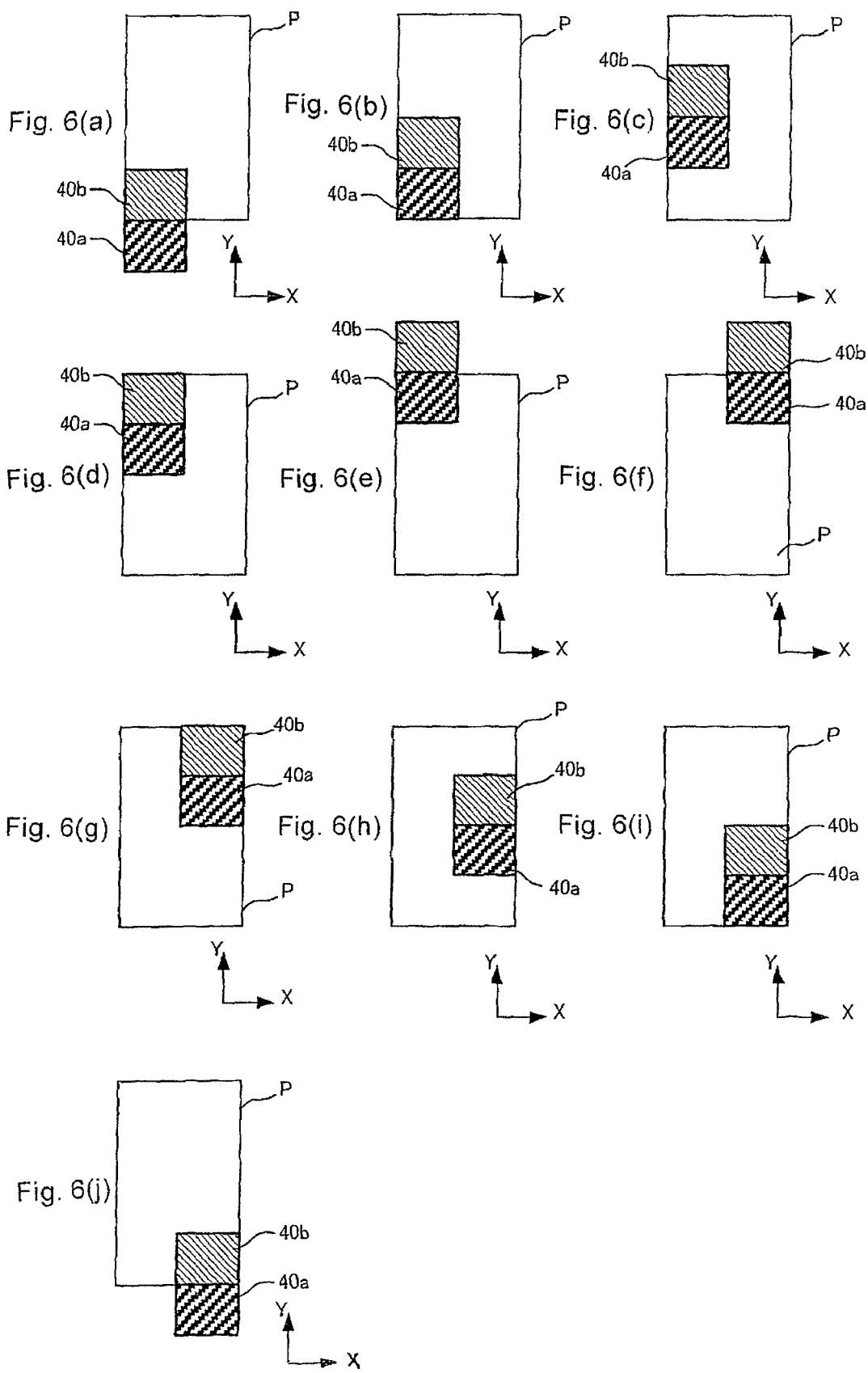

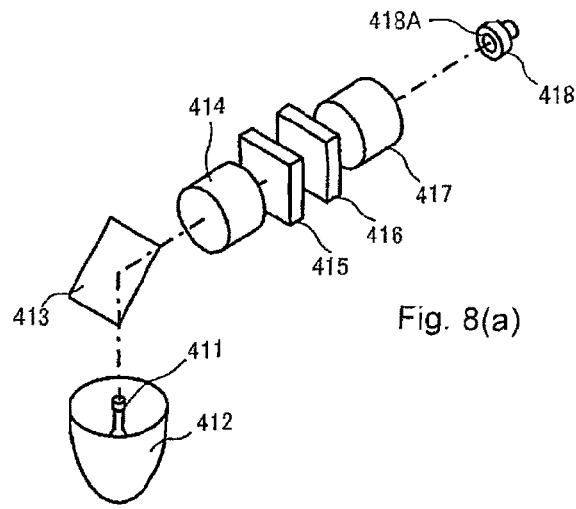
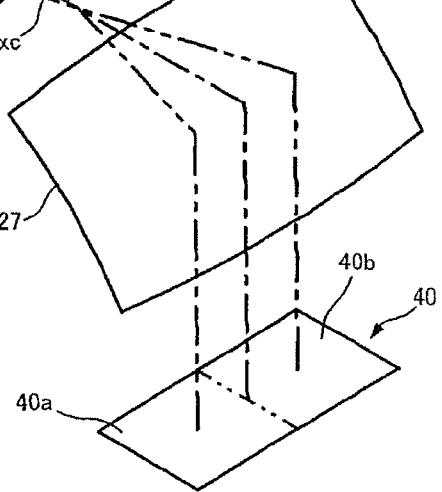
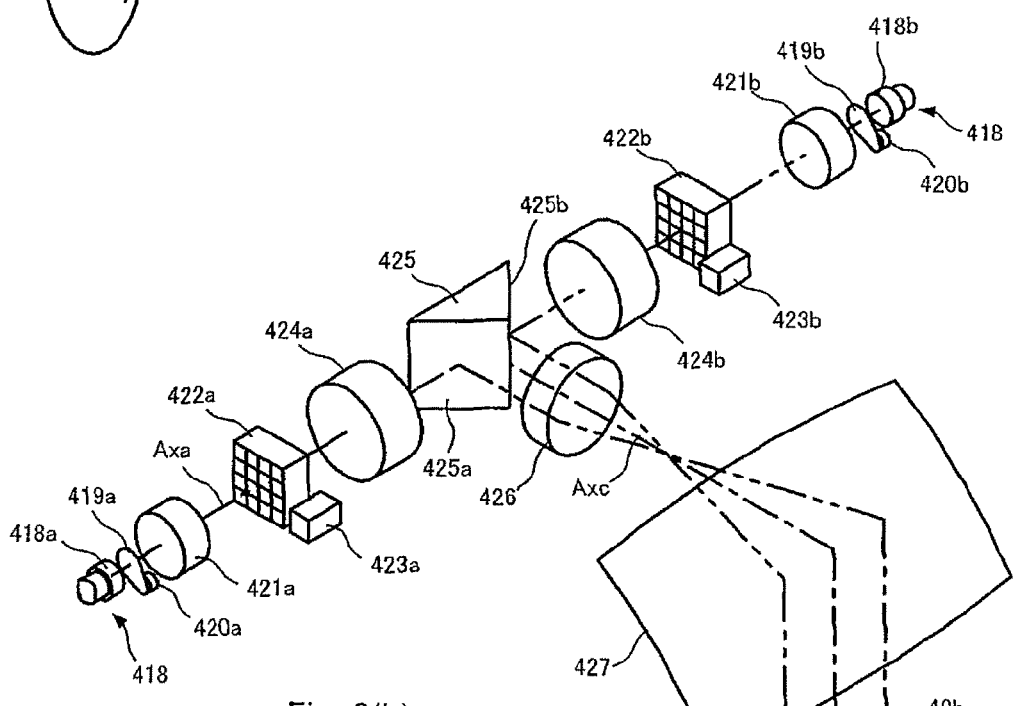
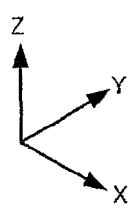
Fig. 8(a)
Fig. 8(b)

Fig. 14(a)
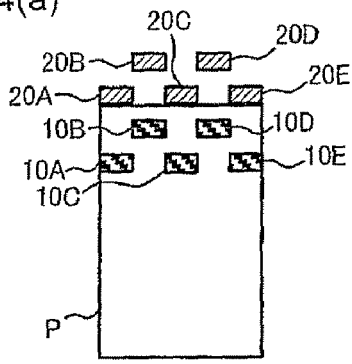
Fig. 14(d)
| A11 | A14 | A12 | A15 | A13 |
|---|---|---|---|---|
| A21 | A24 | A22 | A25 | A23 |
| A31 |  | A32 |  | A33 |
| A41 |  | A42 |  | A43 |
Fig. 14(b)
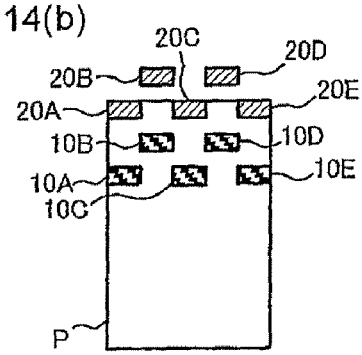
Fig. 14(e)
| A11+B11 | A14 | A12+B12 | A15 | A13+B13 |
|---|---|---|---|---|
| A21 | A24 | A22 | A25 | A23 |
| A31 | A34 | A32 | A35 | A33 |
| A41 |  | A42 |  | A43 |
| A51 |  | A52 |  | A53 |
Fig. 14(c)
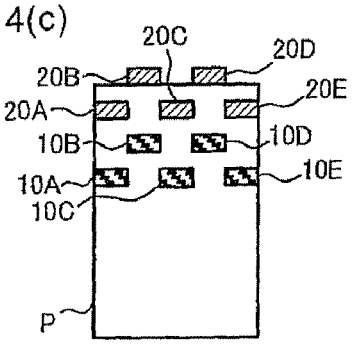
Fig. 14(f)
| A11+B11 | A14 | A12+B12 | A15 | A13+B13 |
|---|---|---|---|---|
| A21+B21 | A24 | A22+B22 | A25 | A23+B23 |
| A31 | A34 | A32 | A35 | A33 |
| A41 | A44 | A42 | A45 | A43 |
| A51 |  | A52 |  | A53 |
| A61 |  | A62 |  | A63 |

| A11+B11 | A14+B14 | A12+B12 | A15+B15 | A13+B13 |
|---|---|---|---|---|
| A21+B21 | A24 | A22+B22 | A25 | A23+B23 |
| A31+B31 | A34 | A32+B31 | A35 | A33+B31 |
| A41 | A44 | A42 | A45 | A43 |
| A51 | A54 | A52 | A55 | A53 |
| A61 | | A62 | | A63 |
| A71 | | A72 | | A73 |

Fig. 18
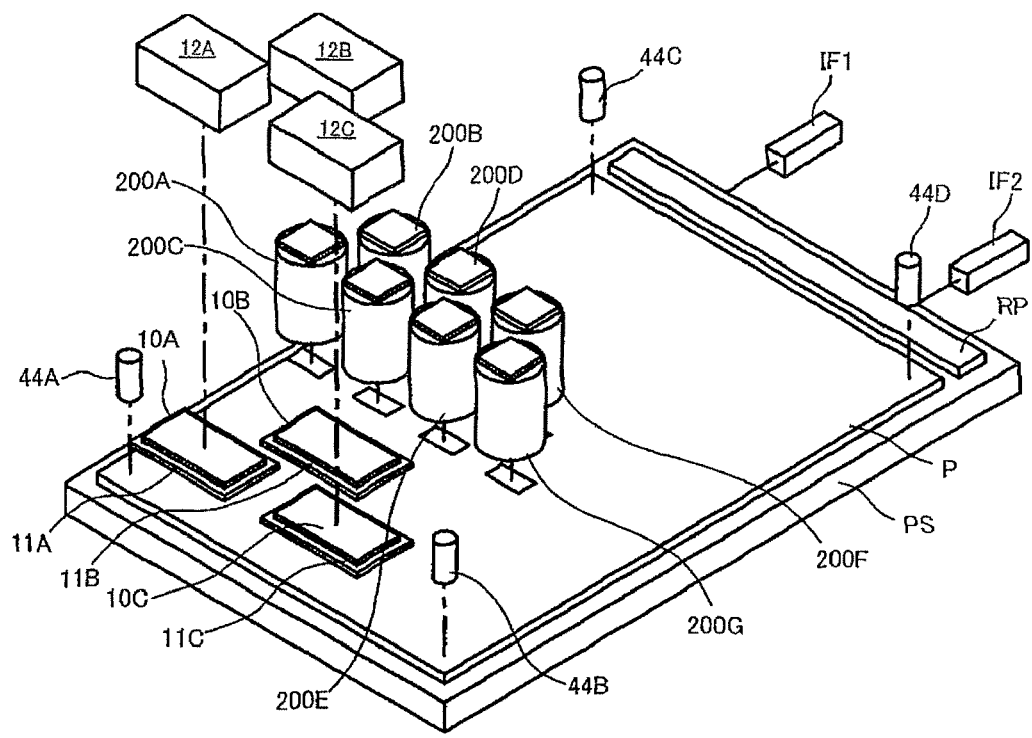
Fig. 18(a)
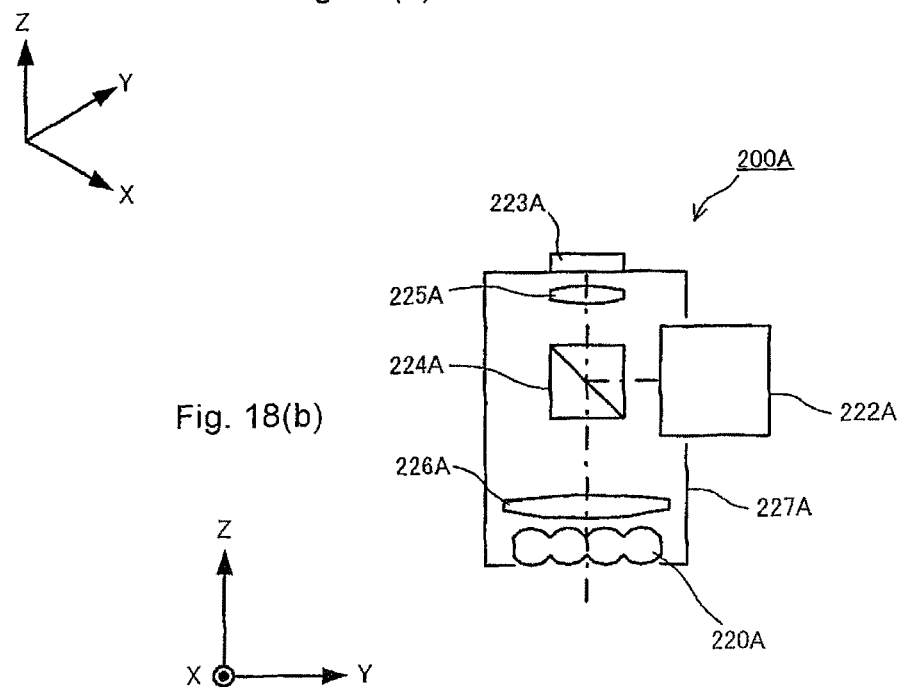
Fig. 18(b)

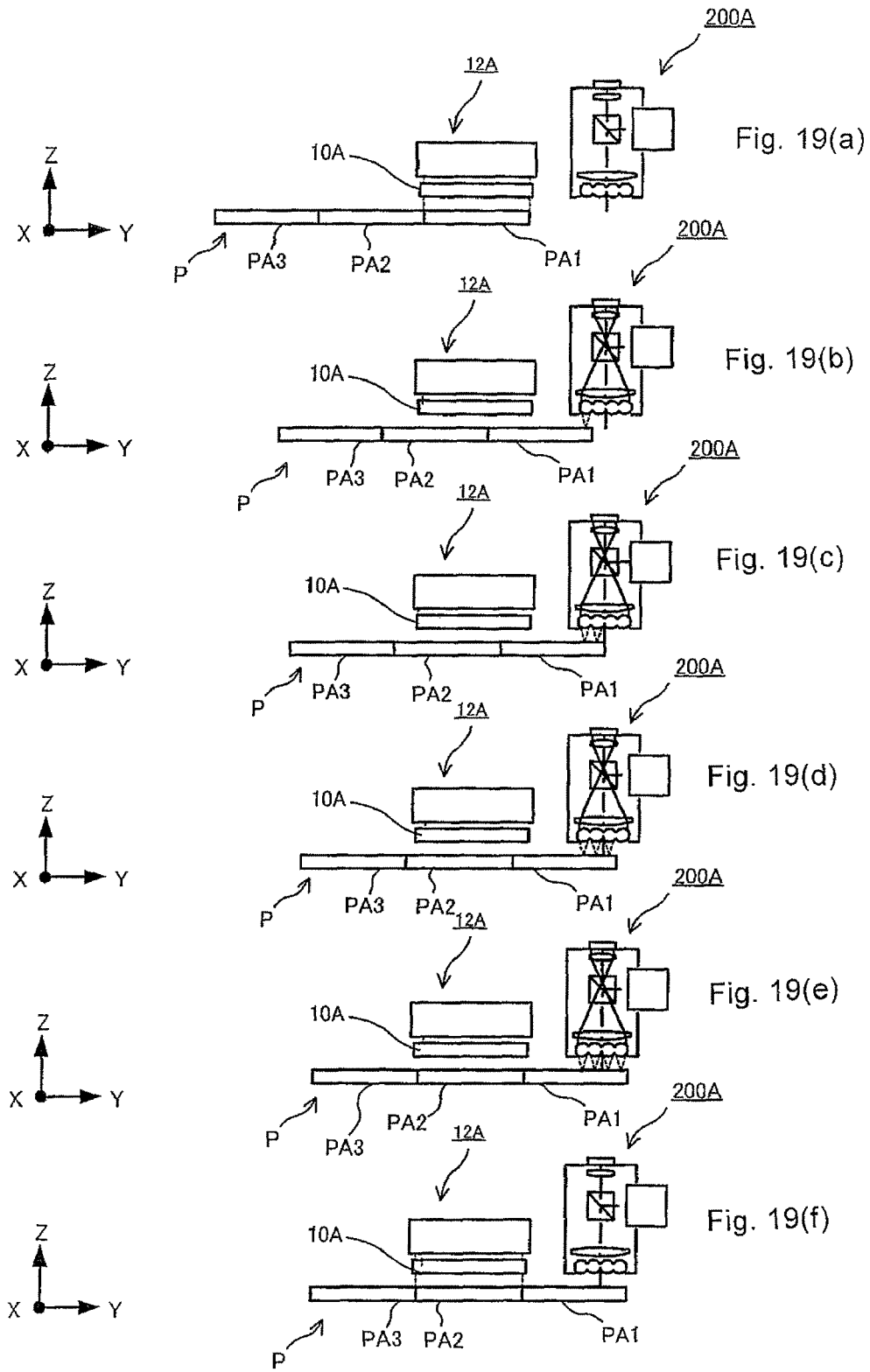

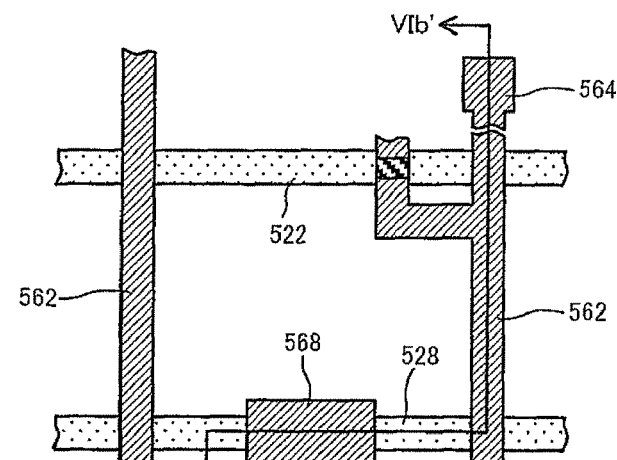
Fig. 23(a)
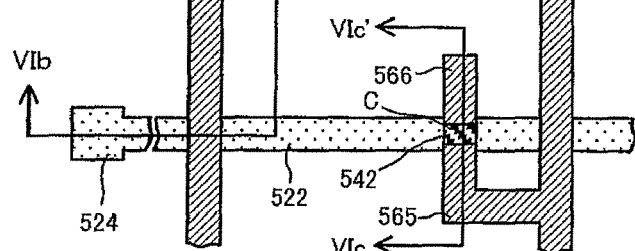
Fig. 23(b)
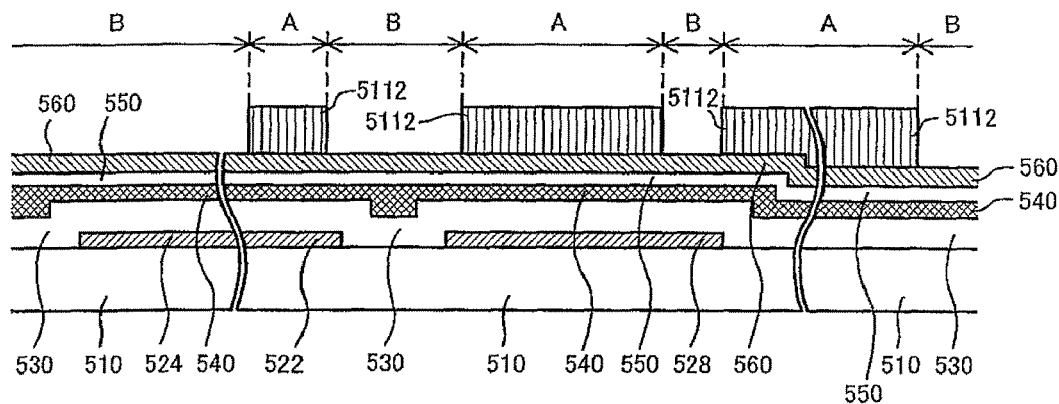
Fig. 23(c)
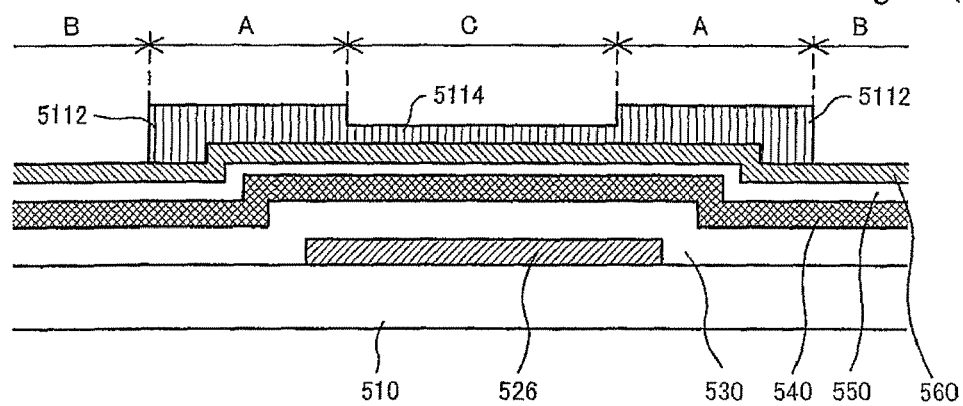

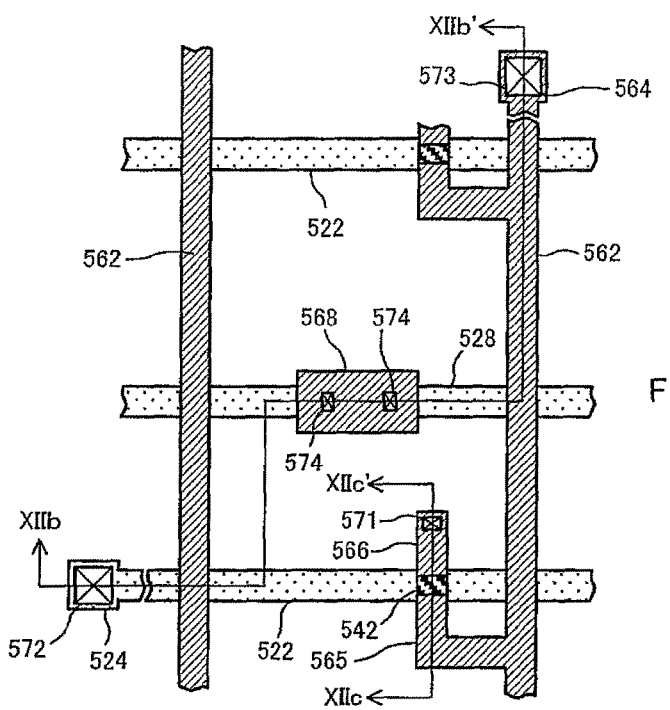
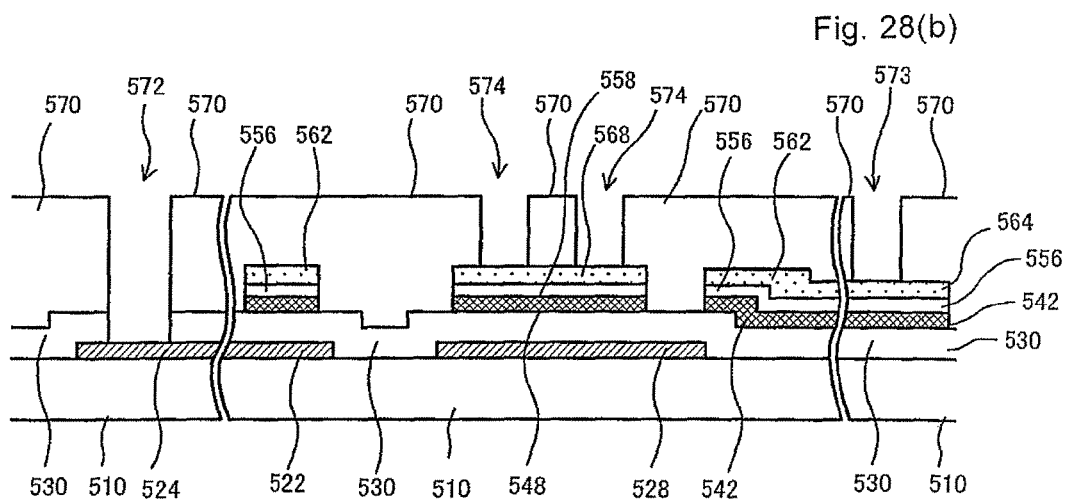
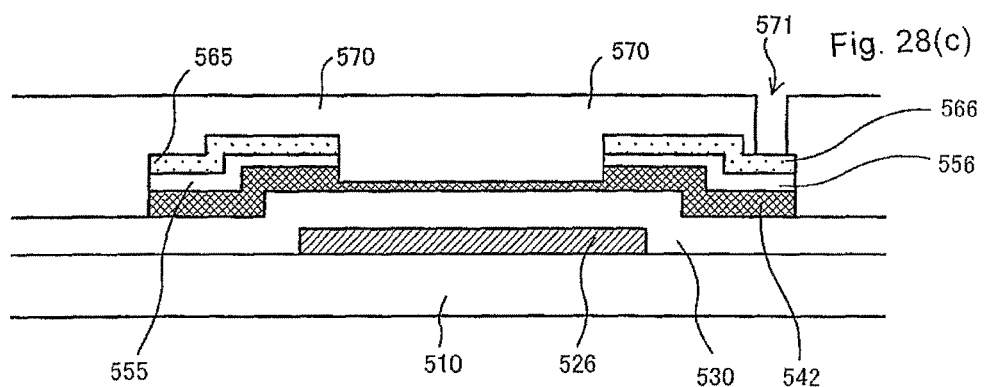
Fig. 28(a)
Fig. 28(b)
Fig. 28(c)

EXPOSURE METHOD, EXPOSURE APPARATUS, LIGHT CONVERGING PATTERN FORMATION MEMBER, MASK, AND DEVICE MANUFACTURING METHOD

CROSS-REFERENCE TO RELATED APPLICATIONS

This application claims the benefit of U.S. Provisional Application No. 60/907,444, filed on Apr. 2, 2007.

BACKGROUND OF THE INVENTION

The present invention relates to an exposure method and an exposure apparatus for exposing a circuit pattern or the like on a photosensitive plate when manufacturing a device such as a semiconductor device, a liquid crystal display device, printed circuit board, a MEMS (Micro Electro Mechanical System), and an optical integrated circuit in a lithography process, a light converging pattern formation member and a mask used in the exposure, a method for designing and manufacturing the light converging pattern formation member and the mask, and a method for manufacturing the device.

An exposure apparatus is used to form a fine pattern on a device, such as a semiconductor device, a liquid crystal display device, a printed circuit board, a MEMS, and an optical integrated circuit, during a process for manufacturing the device (for example, refer to U.S. Pat. No. 4,636,626).

BRIEF SUMMARY OF THE INVENTION

In the exposure apparatus disclosed in the above patent, a pattern is transferred onto a plate using a mask, which is spaced from the plate by a predetermined gap. This blurs the transferred pattern. Thus, fine patterns cannot be transferred. It is an object of the present invention to enable fine patterns to be transferred without being blurred.

An example of the present invention shows an exposure method including a first exposure step of irradiating a mask, which is arranged near a plate, with exposure light and exposing a predetermined pattern formed on the mask onto a plate, and a second exposure step of irradiating a light converging pattern formation member, which is arranged near the plate and includes a plurality of light converging portions, with exposure light and exposing a light converging pattern having a predetermined shape onto the plate. At least part of the predetermined pattern exposed onto the plate in the first exposure step and at least part of the light converging pattern formed on the plate in the second exposure step overlap each other.

An example of the present invention shows an exposure method includes a first exposure step of exposing a predetermined first pattern onto a first region of a plate in a state in which the plate is still relative to the first pattern, a second exposure step of exposing a predetermined second pattern onto the first region of the plate while relatively moving the second pattern and the plate, and a movement step of relatively moving the plate and a position at which the first pattern is formed to expose the first pattern onto a second region of the plate that differs from the first region. The second exposure step is performed when the movement step is performed.

An example of the present invention shows an exposure apparatus including a first holding portion which holds a mask having a predetermined pattern near a plate; a second holding portion holds a light converging pattern formation member, which includes a plurality of light converging portions that form light patterns having predetermined shapes on the plate, near the plate; and an illumination portion irradiates the mask and the light converging pattern formation member with exposure light.

An example of the present invention shows an exposure apparatus including a first exposure portion which exposes a predetermined first pattern onto a first region of a plate; a second exposure portion exposes a predetermined second pattern onto the first region of the plate; a plate moving portion moves the plate along a predetermined first direction; and a control unit controls exposure with the first and second exposure portions and movement of the plate with the plate moving portion. The control unit holds the first pattern and the plate in a relatively still state when the first exposure portion performs exposure. The control unit performs exposure with the second exposure portion when relatively moving the plate and a position at which the first pattern is formed to expose the first pattern onto a second region that differs from the first region of the plate.

An example of the present invention shows a light converging formation member is for use in combination with a mask having a first pattern corresponding to a first light pattern, which is part of a light pattern formed on an exposed body. The light converging formation member includes a plurality of light converging portions for forming a light converging pattern corresponding to a second light pattern, which is another part of the light pattern.

An example of the present invention shows a mask is used in combination with the above light converging pattern formation member. The mask is arrangeable near the exposed body and includes the first pattern.

An example of the present invention shows a designing method for designing the light converging pattern formation member of the example of the present invention includes dividing a light pattern that is to be formed on the exposed body into plural sets of light patterns, obtaining a first light pattern from the plural sets of light patterns by extracting at least one light pattern, obtaining a second light pattern from the plural sets of patterns by extracting at least one pattern that differs from the extracted pattern, and obtaining a parameter of the plurality of light converging portions for forming the second light pattern, wherein at least part of the first light pattern and at least part of the second light pattern overlap each other.

An example of the present invention shows a mask designing method including dividing a light pattern that is to be formed on the exposed body into plural sets of light patterns, obtaining a first light pattern by extracting at least one pattern from the plural sets of light patterns, and generating the first pattern based on the first light pattern.

A manufacturing method for manufacturing the light converging pattern formation member of the example of the present invention includes preparing a light transmissive plate, and processing the light transmissive plate based on design data of the plurality of light converging portions for forming the light converging pattern.

A manufacturing method for manufacturing the mask of the example of the present invention includes preparing a light transmissive plate, and processing the light transmissive plate based on information of the first pattern.

An example of the present invention shows a device manufacturing method including an exposure step using the above exposure method to expose the predetermined pattern and the light converging pattern onto the plate, a development step of developing the plate on which the pattern has been transferred and forming on a surface of the plate a mask layer having a shape corresponding to the pattern, and a processing step of processing the surface of plate by means of the mask layer.

An example of the present invention shows a device manufacturing method including an exposure step using the above exposure apparatus to expose the pattern onto the plate, a development step of developing the plate on which the pattern has been transferred and forming on a surface of the plate a mask layer having a shape corresponding to the pattern, and a processing step of processing the surface of plate by means of the mask layer.

The example of the present invention performs multiple exposure of proximity exposure and light converging pattern exposure with a light pattern formation member. Portions that cannot be resolved through proximity exposure are compensated for by exposing a light converging pattern. This enables the transfer of a fine pattern without a blur.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 1 is schematically diagram showing an exposure apparatus according to a first embodiment of the present invention;

FIG. 2 includes views showing the operation of the first embodiment, where

FIG. 3 includes views showing the structures of the mask 10 and the light converging pattern formation member 20 in the first embodiment, where FIG. 3(a) is a layout diagram of the mask 10, FIG. 3(b) is a view taken along 3b-3b of the mask 10 shown in FIG. 3(a), FIG. 3(c) is a layout diagram of the light converging pattern formation member 20, and FIG. 3(d) is a view taken along 3d-3d of the light converging pattern formation member 20 shown in FIG. 3(c);

FIG. 4 includes views showing modifications of the first embodiment, where

FIG. 6 includes plan views showing changes in the positional relationship between the light pattern formation member 40 and the plate P during an exposure operation performed by the exposure apparatus of the second embodiment;

FIG. 8(a) is a schematically diagram showing the structure of an illumination portion 42 in the exposure apparatus of the second embodiment, and FIG. 8(b) is a view showing an optical layout in an optical path from a light branching portion to a light pattern formation member;

FIG. 13 includes diagrams illustrating exposure operations of the exposure apparatus in the third embodiment, where

FIG. 14 includes diagrams illustrating the exposure operation of the exposure apparatus in the third embodiment, where FIGS. 14(a) to 14(c) are plan views showing changes in positional relationship between the plurality of masks 10A to 10E and the plurality of light converging pattern formation members 20A to 20E relative to the plate P during exposure operations of the exposure apparatus in the third embodiment, and FIGS. 14(d) to 14(f) are diagrams showing exposure fields on the plate P exposed in accordance with the procedures of FIGS. 14(a) to 14(c);

FIG. 15 includes diagrams illustrating exposure operations of the exposure apparatus in the third embodiment, where

FIG. 18 includes views schematically showing the structure of an exposure apparatus according to a fourth embodiment, where FIG. 18(a) is a perspective view showing the entire exposure apparatus, and FIG. 18(b) is a diagram showing a variable light spot generation unit;

FIG. 19 includes views illustrating exposure operations of the exposure apparatus in the fourth embodiment;

FIG. 21 includes diagrams showing the structure of a thin-film transistor plate in a first stage of a method for manufacturing a flat panel display in the fifth embodiment, where

FIG. 22 includes diagrams showing the structure of the thin-film transistor plate in a second stage of the method for manufacturing the flat panel display in the fifth embodiment, where

FIG. 23 includes diagrams showing the structure of the thin-film transistor plate in a third stage of the method for manufacturing the flat panel display in the fifth embodiment, where FIG. 23(a) is a layout diagram, FIG. 23(b) is a cross-sectional view taken along line VIb-VIb' in the layout diagram of FIG. 23(a), and FIG. 23(c) is a cross-sectional view taken along line VIc-VIc' in the layout diagram of FIG. 23(a);

FIG. 25 includes diagrams showing the structure of the thin-film transistor plate in a fourth stage of the method for manufacturing the flat panel display in the fifth embodiment, where

FIG. 26 includes diagrams showing the structure of the thin-film transistor plate in a fifth stage of the method for manufacturing the flat panel display in the fifth embodiment, where

FIG. 27 includes diagrams showing the structure of the thin-film transistor plate in a sixth stage of the method for manufacturing the flat panel display in the fifth embodiment, where

FIG. 28 includes diagrams showing the structure of the thin-film transistor plate in a seventh stage of the method for manufacturing the flat panel display in the fifth embodiment, where FIG. 28(a) is a layout diagram, FIG. 28(b) is a cross-sectional view taken along line XIIb-XIIb' in the layout diagram of FIG. 28(a), and FIG. 28(c) is a cross-sectional view taken along line XIIc-XIIc' in the layout diagram of FIG. 28(a);

FIG. 30 includes diagrams showing the structure of the thin-film transistor plate manufactured in accordance with the method for manufacturing the flat panel display in the fifth embodiment, where

DETAILED DESCRIPTION OF THE PREFERRED EMBODIMENTS

Figure 2A:
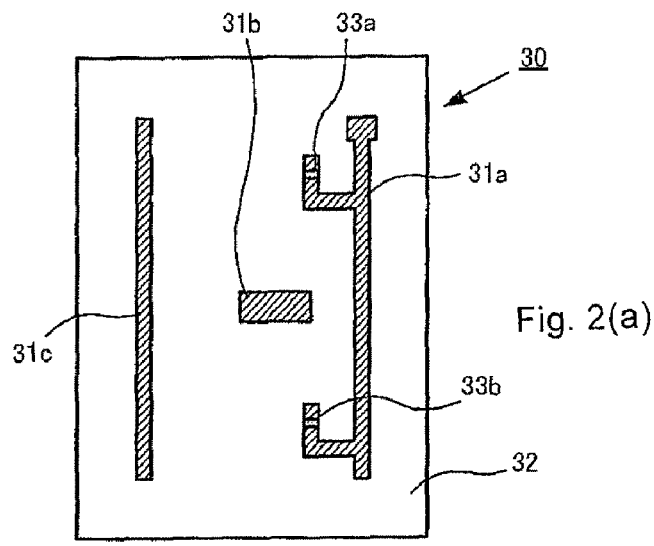
FIG. 2(a) is a plan view showing one example of a light pattern exposed onto a plate P.

An embodiment of the present invention will now be discussed with reference to the accompanying drawings. FIG. 1 is a schematic diagram showing the structure of an exposure apparatus according to a first embodiment of the present invention. In FIG. 1, an X axis and a Y axis are set in directions parallel to a plate P, and a Z axis is set in a direction orthogonal to the plate P. More specifically, an XY plane is set to be parallel to a horizontal plane, and a +Z axis is set to be directed upward along a vertical direction.

As shown in FIG. 1, the exposure apparatus of the first embodiment includes a first holding portion 11, a second holding portion 21, and illumination portions 12 and 22. The first holding portion 11 holds a mask 10 including a mask pattern, which is a predetermined light shield or light reduction pattern, near the plate P. The second holding portion 21 holds a light converging pattern formation member 20, which includes a plurality of light converging portions (lens surfaces) 20a and 20b to form a light pattern having a predetermined shape on the plate P, near the plate P. The illumination portions 12 and 22 irradiate exposure light on the mask 10 and the light converging pattern formation member 20.

The plate P is arranged on a plate stage PS that holds the plate P to be movable along at least the Y axis.

The first holding portion 11 for holding the mask 10 and the second holding portion 21 for holding the light converging pattern formation member 20 are formed so as to align the mask 10 and the light converging pattern formation member 20 along the Y direction.

An example of the plate P in the present embodiment is a flat rectangular glass plate of a rectangular flat plate shape having one side or a diagonal line with a length that is greater than 500 mm. Photoresist (photosensitive material) for manufacturing a liquid crystal display device is applied to the plate P. A ceramics plate for manufacturing a thin-film magnetic head, a circular semiconductor wafer for manufacturing a semiconductor device, and the like may be used as the plate P.

The operation of the exposure apparatus in the present embodiment will now be discussed with reference to FIG. 2. FIG. 2(a) is a plan view showing one example of a light pattern exposed onto the plate P, FIG. 2(b) is a plan view showing a light pattern formed on the plate P by the mask 10, and FIG. 2(c) is a plan view showing a light pattern formed on the plate P by the light converging pattern formation member 20.

In FIG. 2(a), the light pattern 30 exposed onto the plate P includes dark pattern portions 31a, 31b, and 31c having light intensity that is substantially zero, a bright pattern portion 32 having a predetermined light intensity, and intermediate intensity light pattern portions 33a and 33b having a light intensity that is less than that of the bright pattern portion 32. The intermediate intensity light pattern portions 33a and 33b are used to form a gate electrode in a TFT transistor circuit for a flat panel display of a liquid crystal display device or the like and have extremely small dimensions of, for example, about 2 to 3 μm.

Figure 2B:
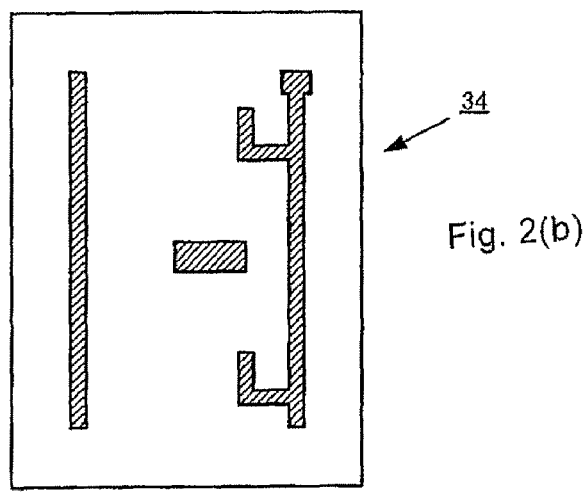
FIG. 2(b) is a plan view showing a light pattern formed on the plate P by a mask 10.
Figure 2C:
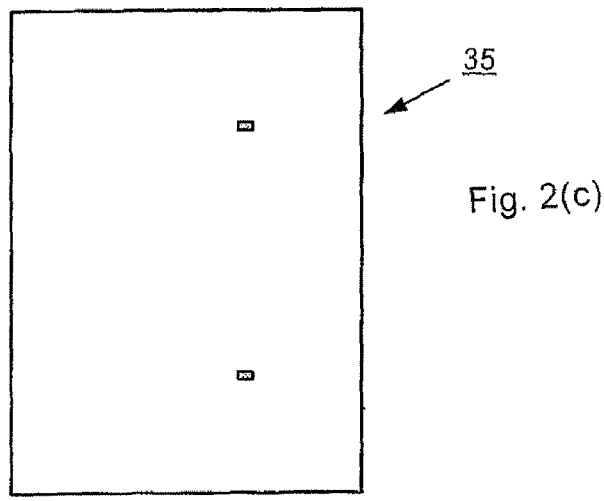
FIG. 2(c) is a plan view showing a light pattern formed on the plate P by a light converging pattern formation member 20.

In the present embodiment, the light pattern 30 shown in FIG. 2(a) is separated into a light pattern 34 having rough dimensions as shown in FIG. 2(b) and a light pattern 35 having fine dimensions (fine feature) as shown in FIG. 2(c). The light pattern 34 in FIG. 2(c) corresponds to the intermediate intensity light pattern portions 33a and 33b having extremely small dimensions as shown in FIG. 2(a).

FIG. 3 includes diagrams showing the structure of the mask 10 and the light converging pattern formation member 20 used to form the light patterns 34 and 35, where FIG. 3(a) is a layout diagram of the mask 10, FIG. 3(b) is a view taken along 3b-3b of the mask 10 shown in FIG. 3(a), FIG. 3(c) is a layout diagram of the light converging pattern formation member 20, and FIG. 3(d) is a view taken along 3d-3d of the light converging pattern formation member 20 shown in FIG. 3(c).

The mask 10 shown in FIGS. 3(a) and 3(b) includes light shield portions (light reduction portions) 10a, 10b, 10c, which are light shield or light reduction patterns of chromium, chromium oxide, or the like formed on a light transmissive plate. The mask 10 is spaced apart by a predetermined gap (proximity gap) from the plate P, as shown in FIG. 1, so that the exposure light from the illumination portion 12 forms the light pattern 34 shown in FIG. 2(b) on the plate P.

The light converging pattern formation member 20 shown in FIGS. 3(c) and (d) have lens surfaces 20a and 20b formed on the light transmissive plate, and a light shield portion (light reduction portion) 20c, which is a light shield or light reduction pattern, formed outside the lens surfaces 20a and 20b. As shown in FIG. 1, the light converging pattern formation member 20 is spaced apart by a predetermined gap from the plate P so that the light pattern (light converging pattern) 35 shown in FIG. 2(c) forms on the plate P by collecting the exposure light from the illumination portion 22 on the lens surfaces 20a and 20b.

As shown in FIG. 1, the mask 10 and the light converging pattern formation member 20 are aligned in the Y direction. Thus, the light pattern 34 is first batch-exposed onto a specific section of the plate P by the mask 10, the plate stage PS is then step moved in the Y direction. Then, the light pattern 35 is batch-exposed in a manner overlapping the exposed specific section of the plate P with the light converging pattern formation member 20 so that a latent image equivalent to when the light pattern 30 shown in FIG. 2(a) is exposed, forms on the photosensitive material applied to the plate P.

For example, to irradiate collimated light onto the light converging pattern formation member 20 (when a collimation half angle is substantially 0°), when the gap (proximity gap) along the Z direction between the light converging pattern formation member 20 and the plate P is 100 μm and the width of the light converging pattern 35 is 3 μm, the plate P side numerical aperture NAP of the lens surfaces 20a and 20b of the light converging pattern formation member 20 only needs to be about 0.082. In order to obtain such a plate P side numerical aperture NAP, when the focal length of the lens surfaces 20a and 20b is 100 μm to arrange the focal position on the plate P, the aperture diameter of the lens surfaces 20a and 20b only needs to be about 300 μm.

The collimation half angle of the exposure light that irradiates the light converging pattern formation member 20 may be, for example, 0° to 5°, and the proximity gap may be 1 μm to 1000 μm.

The shape of each feature included in the light pattern 35 shown in FIG. 2(c) is rectangular and elongated in one direction. Thus, the lens surface 20a and 20b corresponding to the features are cylindrical lens. In this case, the axial direction of the lens surface of the cylindrical lens surfaces 20a and 20b coincides with the longitudinal direction of the light pattern 35. The specification of the above example is a one-dimensional specification extending along a direction (direction of a line that most strongly refracts light, strong principal meridian direction) that is orthogonal to the axial direction of the cylindrical lens (direction of a line that does not refract light).

A cross-sectional shape taken along the strong principal meridian direction of the cylindrical shape may be a circle, an ellipse, or the like.

FIG. 4 includes diagrams showing modifications of the lens surfaces 20a and 20b of the light converging pattern formation member. FIG. 4(a) is a layout diagram of the light converging portions 20a and 20b of the light converging pattern formation member 20, FIG. 4(b) is a plan view of a first modification of the light converging portion, FIG. 4(c) is a cross-sectional view of FIG. 4(b), FIG. 4(d) is a plan view of a second modification of the light converging portion, FIG. 4(e) is a cross-sectional view of FIG. 4(d), FIG. 4(f) is a plan view of a third modification of the light converging portion, FIG. 4(g) is a cross-sectional view of FIG. 4(f), FIG. 4(h) is a plan view of a fourth modification of the light converging portion, FIG. 4(i) is a cross-sectional view of FIG. 4(h), FIG. 4(j) is a plan view of a fifth modification of the light converging portion, and FIG. 4(k) is a cross-sectional view of FIG. 4(j).

Figure 4A:
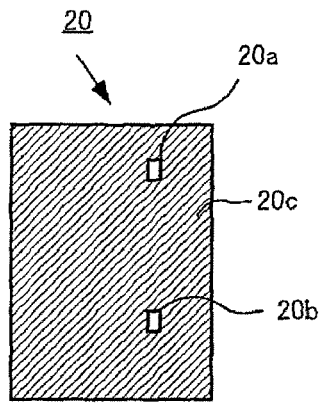
FIG. 4(a) is a layout diagram of light converging portions 20a and 20b in the light converging pattern formation member 20.
Figure 4B:
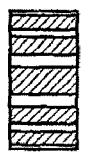
FIG. 4(b) is a plan view of a first modification of the light converging portion.

In the first modification shown in FIGS. 4(b) and (c), the light converging portion of the light converging pattern formation member 20 shown in FIG. 4(a) is a bright-dark type (amplitude type) one-dimensional fresnel lens having a power equivalent to the cylindrical lens. The bright-dark type one-dimensional fresnel lens includes light shield strips, which are made of the same light shield material same as that of the light shield portion 20c, arranged in a predetermined one-dimensional direction, and shaped to extend in a direction orthogonal to the one-dimensional direction. The bright-dark type one-dimensional fresnel lens of the first modification may be manufactured in a significantly inexpensive manner since the light converging portion and the light shield portion 20c may be formed in the same lithography process. Furthermore, the first modification has an advantage in that the light shield pattern of the mask 10 and the bright-dark pattern of the light converging portion can be formed in the same process even when forming the mask 10 and the light converging pattern formation member on the same plate.

Figure 4D:
FIG. 4(d) is a plan view of a second modification of the light converging portion.

In the second modification shown in FIGS. 4(d) and (e), the light converging portion of the first modification shown in FIGS. 4(b) and (c) is a bright-dark type anamorphic fresnel lens having a power equivalent to a toric lens. In such a structure, the dimension of the light converging pattern formed on the plate P may be controlled in a two-dimensional manner. For instance, the numerical aperture of the anamorphic fresnel lens (size of the anamorphic fresnel lens) is set to an appropriate value in each of two directions that are orthogonal to each other when forming a rectangular light converging pattern on the plate P. This independently controls the dimensions of the rectangle in the direction of the long sides and the direction of the short sides.

Figure 4F:
FIG. 4(f) is a plan view of a third modification of the light converging portion.
Figure 4C:
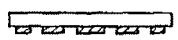
FIG. 4(c) is a cross-sectional view of the first modification.
Figure 4E:
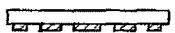
FIG. 4(e) is a cross-sectional view of the second modification.
Figure 4G:
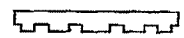
FIG. 4(g) is a cross-sectional view of the third modification.

In the third modification shown in FIGS. 4(f) and 4(g), the light converging portion of the first modification shown in FIGS. 4(b) and (c) is a phase type one-dimensional fresnel lens. Such a structure has an advantage in that the light quantity loss in the light converging portion can be reduced. In the third modification, the light converging portion may be modified to an anamorphic fresnel lens in the same manner as in the second modification.

Figure 4H:
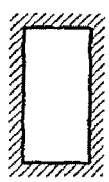
FIG. 4(h) is a plan view of a fourth modification of the light converging portion.

In the fourth modification shown in FIGS. 4(h) and (i), the lens surfaces 20a and 20b of the light converging pattern formation member are formed so that the peaks of the lens surfaces are located at the same level or slightly inward level of the light converging pattern formation member. In the structure of the fourth modification, the etched amount of the light transmissive plate is small when forming the lens surfaces by processing the light transmissive plate through methods such as etching. Furthermore, the manufacturing of the light converging pattern formation member is facilitated.

Figure 4J:
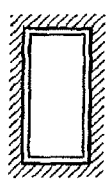
FIG. 4(j) is a plan view of a fifth modification of the light converging portion.
Figure 4I:
FIG. 4(i) is a cross-sectional view of the fourth modification.
Figure 4K:
FIG. 4(k) is a cross-sectional view of the fifth modification.

In the fifth modification shown in FIGS. 4(j) and (k), the lens surfaces 20a and 20b of the light converging pattern formation member are formed on the surface at the light entering side of the light converging pattern formation member 20. Therefore, the arrangement of the light converging portion of the light converging pattern formation member is not limited to the surface at the side of the plate P (light exit side) and may be on the surface at the light entering side of the light converging pattern formation member 20. The first to the fourth modifications may be modified in accordance with the teaching of the fifth modification.

A plate made of material that transmits ultraviolet light such as silica glass plate may be used as the light transmissive plate.

Figure 5:
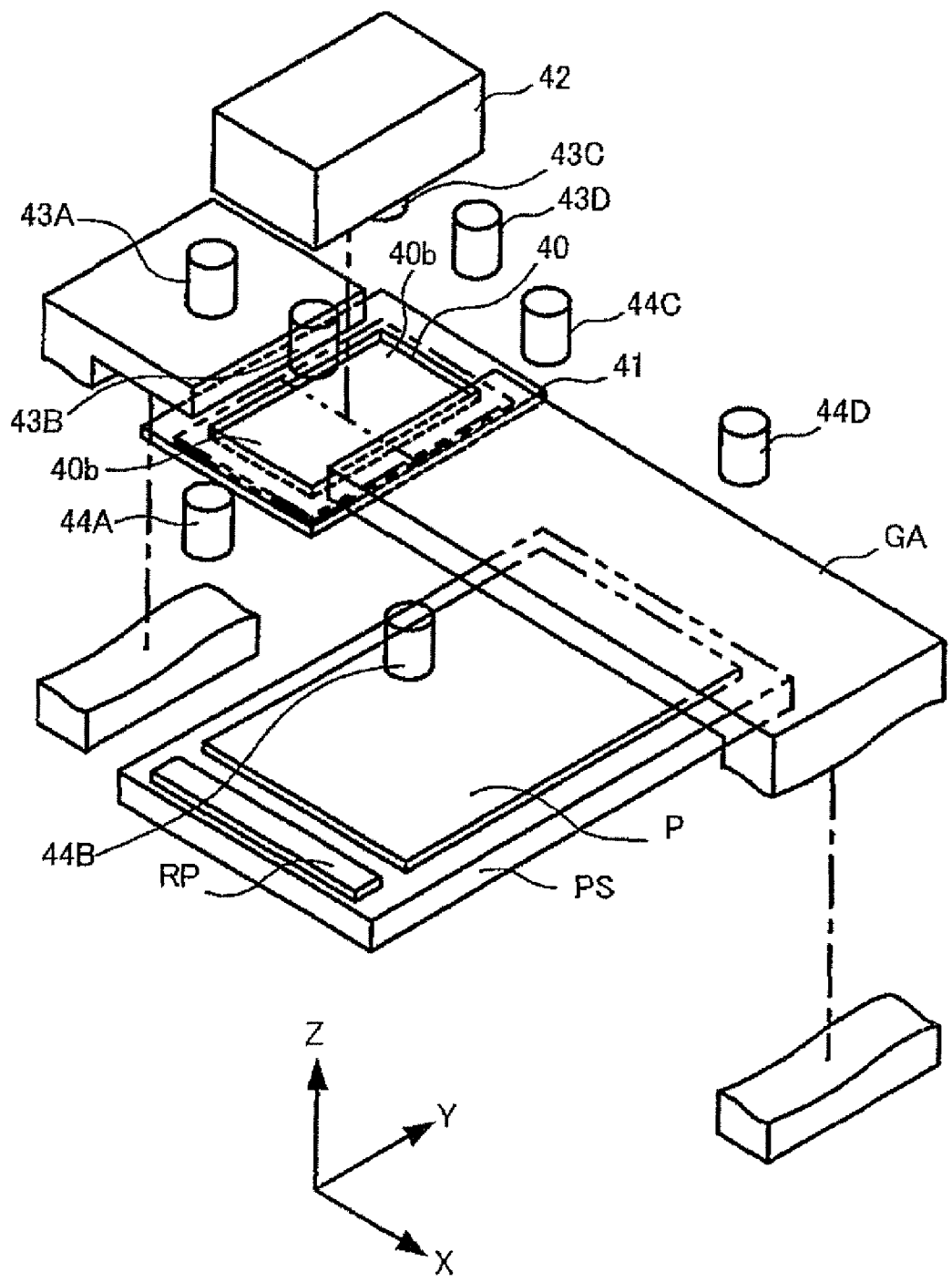
FIG. 5 is a schematic diagram showing an exposure apparatus according to a second embodiment of the present invention.

FIG. 5 is a view schematically showing an exposure apparatus according to a second embodiment of the present invention. In FIG. 5, the X axis and the Y axis are set in directions parallel to a plate P, and the Z axis is set in a direction orthogonal to the plate P. In FIG. 5, an X axis and a Y axis are set in directions parallel to a plate P, and a Z axis is set in a direction orthogonal to the plate P. More specifically, an XY plane is set to be parallel to a horizontal plane, and a +Z axis is set to be directed upward along a vertical direction.

In the first embodiment, the exposure is performed on the plate P using the mask 10 and the light converging pattern formation member 20. In the second embodiment shown in FIG. 5, the exposure is performed using a light pattern formation member 40 in which a mask pattern region 40a, equivalent to the mask 10, and a light converging portion formation region 40b, having a structure equivalent to the light converging portion of the light converging pattern formation member 20, are formed on a single light transmissive plate.

In FIG. 5, the light pattern formation member 40 is attracted and held by a holding portion 41 from the upper side (+Z axis direction side). The holding portion 41 is attached to a support GA to be movable in the Z axis direction and inclinable (pivotal) about the X axis and the Y axis with respect to the support GA. The holding portion 41 is drive controlled by a plurality of actuators (not shown) so that the light pattern formation member 40 becomes parallel to the plate P with a predetermined gap therebetween. In FIG. 5, the structure toward the illumination portion 42 from the light pattern formation member 40 is illustrated in a state spaced more than actual to the +Z direction to facilitate understanding. The holding portion 41 has a first holding portion for holding the mask and a second holding portion for holding the light converging pattern formation member that are formed integrally with each other.

The illumination portion 42 supplies exposure light to the mask pattern region 40a and the light converging portion formation region 40b of the light pattern formation member 40. The illumination portion 42 independently executes control for the supplying and stopping of the exposure light to the mask pattern region 40a and control for supplying and stopping the exposure light to the light converging portion formation region 40b. The detailed structure of the illumination portion 42 will hereinafter be described in detail.

The plate P, to which photosensitive material is applied, is held by a plate stage PS, which is arranged to be movable in the XY plane. The plate P is moved along the XY plane as viewed in the drawing by the drive control of a plate stage drive unit (not shown). A reference plate RP, which has an alignment reference mark, is arranged at a location separated from the region of the XY plane on the plate stage P in which the plate P is arranged.

The exposure apparatus of the second embodiment includes first alignment systems 43A to 43D, which detect the position of the light pattern formation member 40 in the XY plane, and second alignment systems 44A to 44D, which detect the position of the plate P in the XY plane.

The first alignment systems 43A to 43D detect the position of the light pattern formation member 40 in the XY plane with respect to the reference plate RP. That is, the coordinates of the reference plate RP in the XY plane are managed by a stage position measurement unit, which measures the position of the plate stage PS in the XY plane that includes the reference plate RP, so that the positions of the first alignment systems 43A to 43D with respect to the reference plate RP become known by detecting the reference mark on the reference plate RP with the first alignment systems 43A to 43D. The position of the light pattern formation member 40 with respect to a reference plate of which XY coordinates are managed can be indirectly obtained by detecting the position of the light pattern formation member 40 with the first alignment systems 43A to 43D.

The second alignment systems 44A to 44D detect the position of the plate P in the XY plane with respect to the reference plate RP. As described above, the coordinates in the XY plane of the reference plate RP are managed so that the positions of the second alignment systems 44A to 44D with respect to the reference plate RP become known by detecting the reference mark on the reference plate RP with the second alignment systems 44A to 44D. The position of the plate P with respect to a reference plate of which XY coordinates are managed can be indirectly obtained by detecting the position of the plate P with the second alignment systems 44A to 44D.

The exposure operation performed by the exposure apparatus of the second embodiment will now be described with reference to FIG. 6 and FIG. 7. FIG. 6 includes plan views showing changes in the positional relationship between the light pattern formation member 40 and the plate P during the exposure operation of the exposure apparatus of the second embodiment. FIG. 7 includes diagrams showing an exposure field on the plate P exposed in accordance with the procedures of FIG. 6.

The alignment procedure described above is performed before the exposure operation. Therefore, the relative positional relationship between the light pattern formation member 40 and the plate P is constantly managed by the stage position measurement unit.

Figure 7A:
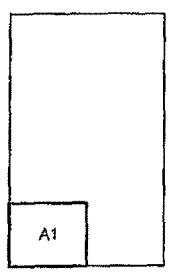
FIG. 7 includes diagrams showing exposure fields on the plate P exposed in accordance with the procedures of FIG. 6.

As shown in FIG. 6(a), the plate stage PS is drive controlled so that only the light converging portion formation region 40b of the light pattern formation member 40 overlaps the plate P. Then, the illumination portion 42 irradiates the light converging portion formation region 40b with exposure light. As shown in FIG. 7(a), an exposure field A1 is formed on the plate P by performing a batch exposure operation.

Figure 7B:
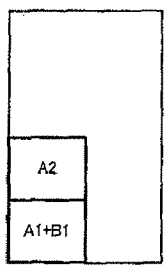

Thereafter, the plate stage PS is step moved in the −Y direction so that the mask pattern region 40a of the light pattern formation member 40 overlaps the exposure field A1. Then, the illumination portion 42 irradiates the mask pattern region 40a and the light converging portion formation region 40b with exposure light. As shown in FIG. 7(b), an exposure field B1 overlapping the exposure field A1 is formed on the plate P by the exposure light that passes through the mask pattern region 40a. At the same time, an exposure region A2 adjacent to the exposure field B1 in the +Y direction side is formed by the exposure light passing through the light converging portion formation region 40b.

Figure 7C:
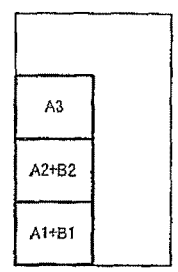
Figure 7D:
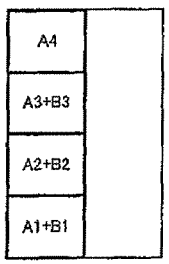

As shown in FIGS. 6(c) and 6(d), the step movement of the plate stage PS in the −Y direction, and the irradiation of the exposure light onto the mask pattern region 40a and the light converging portion formation region 40b by the illumination portion 42 are repeated to form exposure fields A3, A4, B2, and B3 as shown in FIGS. 7(c) and 7(d).

Figure 7E:
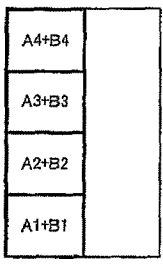

The plate stage PS is then step moved in the −Y direction so that the mask pattern region 40a of the light pattern formation member 40 overlaps the exposure field A4 to obtain the positional relationship shown in FIG. 6(e). Then, the illumination portion 42 irradiates only the mask pattern region 40a with exposure light. As shown in FIG. 7(e), an exposure field B4 overlapping the exposure field A4 is formed on the plate P by the exposure light that passes through the mask pattern region 40a.

Figure 7F:
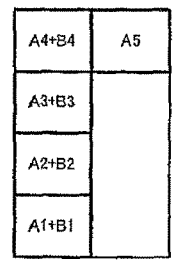

The plate stage PS is then step moved in the −X direction to obtain the positional relationship of the light pattern formation member 40 and the plate P shown in FIG. 6(f). Then, the illumination portion 42 irradiates only the mask pattern region 40a with exposure light. As shown in FIG. 7(f), an exposure field A5 adjacent to the exposure fields A4 and B4 of the plate P in the +X direction side is formed by the exposure light that passes through the mask pattern region 40a.

Figure 7G:
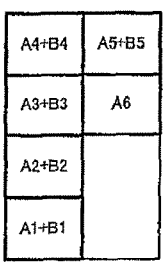

The plate stage PS is then step moved in the +Y direction so that the light converging portion formation region 40b of the light pattern formation member 40 overlaps the exposure field A5 to obtain the positional relationship shown in FIG. 6(g). The illumination portion 42 then irradiates the mask pattern region 40a and the light converging portion formation region 40b with exposure light. Then, an exposure field B5 overlapping the exposure field A5 is formed by the exposure light passing through the mask region 40a. An exposure field A6 adjacent to the exposure field B5 in the −Y direction side is formed by the exposure light that passes through the light converging portion formation region 40b, as shown in FIG. 7(g).

Figure 7H:
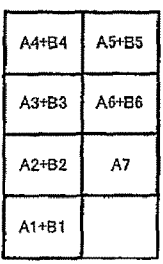
Figure 7I:
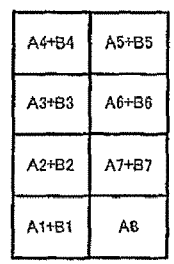

Thereafter, as shown in FIGS. 6(h) and 6(i), the step movement of the plate stage PS in the +Y direction, and the irradiation of the exposure light onto the mask pattern region 40a and the light converging portion formation region 40b by the illumination portion 42 are repeated to form exposure fields A7, A8, B6, and B7 as shown in FIGS. 7(h) and 7(i).

Figure 7J:
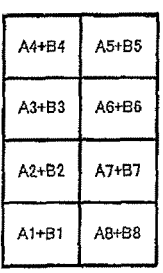

The plate stage PS is then step moved in the +Y direction so that the light converging portion formation region 40b of the light pattern formation member 40 overlaps the exposure field A8 to obtain the positional relationship shown in FIG. 6(j). The illumination portion 42 irradiates only the light converging portion formation region 40b with exposure light, and an exposure field B8 overlapping the exposure field A8 is formed by the exposure light that passes through the light converging portion formation region 40b, as shown in FIG. 7(j).

In the exposure apparatus of the second embodiment, the plate stage PS is movable in the XY direction. Thus, the light pattern formation member 40 can be miniaturized relative to the plate P. Furthermore, the cost of the light pattern formation member 40 is reduced, the influence of deflection caused by gravitational force of the light pattern formation member 40 is reduced, and light pattern exposure is performed with high accuracy.

The structure of the illumination portion 42 will now be described with reference to FIG. 8. FIG. 8(a) is a view showing an optical arrangement along an optical path from a light source to a light branching portion, and FIG. 8(b) is a view showing an optical arrangement along an optical path from the light branching portion to the light pattern formation member. In FIG. 8, an X axis and a Y axis are set in directions parallel to a plate P, and a Z axis is set in a direction orthogonal to the plate P. More specifically, an XY plane is set to be parallel to a horizontal plane, and a +Z axis is set to be directed upward along a vertical direction.

In FIG. 8(a), a light beam that exits from a light source 411, which includes an ultrahigh pressure mercury lamp light source and the like, is reflected by an elliptical mirror 412 and a dichroic mirror 413 to enter a collimator lens 414. A reflection coating of the elliptical mirror 412 and a reflection coating of the dichroic mirror 413 retrieves light in a wavelength band that includes light of a g line (wavelength of 436 nm), an h line (wavelength of 405 nm), and an i line (wavelength of 365 nm). The light of wavelength band that includes the light of g, h, and i lines enter the collimator lens 414. The light source 411 is arranged at a first focal position of the elliptical mirror 412. Thus, the light of the wavelength band including the light of g, h, and i lines form a light source image at a second focal position of the elliptical mirror 412. The diffused light beams from the light source image formed at the second focal position of the elliptical mirror 412 are converted to collimated light beams by the collimator lens 414 and transmitted through a wavelength selection filter 415, which transmits light beams of only a predetermined exposure wavelength band.

The illumination light that passes through the wavelength selection filter 415 further passes through a light reduction filter 416. A condenser lens 417 converges the light at an inlet port 418A of a light guide fiber 418. The light guide fiber 418, which is a random light guide fiber formed by randomly bundling many fiber lines, and includes the inlet port 418A and two outlet ports (hereinafter referred to as outlet ports 418a, 418b).

As shown in FIG. 8(b), the illumination light entering the inlet port 418A of the light guide fiber 418 is propagated through the light guide fiber 418. Then, the illumination light is divided and emitted from the two outlet ports 418a and 418b to respectively enter two partial illumination optical systems for partially illuminating the mask pattern region 40a and the light converging portion formation region 40b of the light pattern formation member 40.

The illumination lights emitted from the outlet ports 418a and 418b of the light guide fiber 418 pass through shutters 419a and 419b arranged near outlet ports 8b to 8f. Then, the lights are respectively converted to collimated light beams by collimator lenses 421a and 421b and enter fly's eye lenses 422a and 422b, which are optical integrators. Illumination lights from a large number of two-dimensional light sources formed at a rear focal surface of the fly's eye lenses 422a and 422b respectively enter deflection-reflection surfaces 425a and 425b of an optical path composite member 425 through the condenser lenses 424a and 424b. This forms two adjacent illumination regions on a surface extending through the contours of the two deflection-reflection surfaces 425a and 425b.

The lights from the two illumination regions are guided to the light pattern formation member 40 by a re-imaging optical system including a condenser lens group 426 and a deflection concave mirror 427. In this case, the image of one of the two illumination regions is formed on the mask pattern region 40a of the light pattern formation member 40, and the image of the other illumination region is formed on the light converging portion formation region 40b.

Shutter drive portions 420a and 420b respectively drive control the shutters 419a and 419b of the two partial illumination optical systems so as to independently control ON/OFF for illumination of the mask pattern region 40a and the light converging portion formation region 40b of the light pattern formation member 40. The fly's eye lenses 422a and 422b of the two partial illumination optical systems are arranged so that the position in the optical axis direction and the position in a plane perpendicular to the optical axis can be changed. Further, the fly's eye lenses 422a and 422b are respectively drive controlled by fly's eye lens drive portions 423a and 423b so that the position in the optical axis direction and the position in the plane perpendicular to the optical axis can be changed. This enables the telecentricity (telecentric characteristics) of the illumination light that enters the mask pattern region 40a and the light converging portion formation region 40b of the light pattern formation member 40 to be controlled. The fly's eye lens drive portions 423a, 423b serves as illumination telecentricity control units.

FIG. 9 includes views illustrating that magnification of the light converging pattern by the light converging portion formation region 40b can be controlled by controlling the telecentricity of the illumination light.

Figures 9A, 9B, 9C:
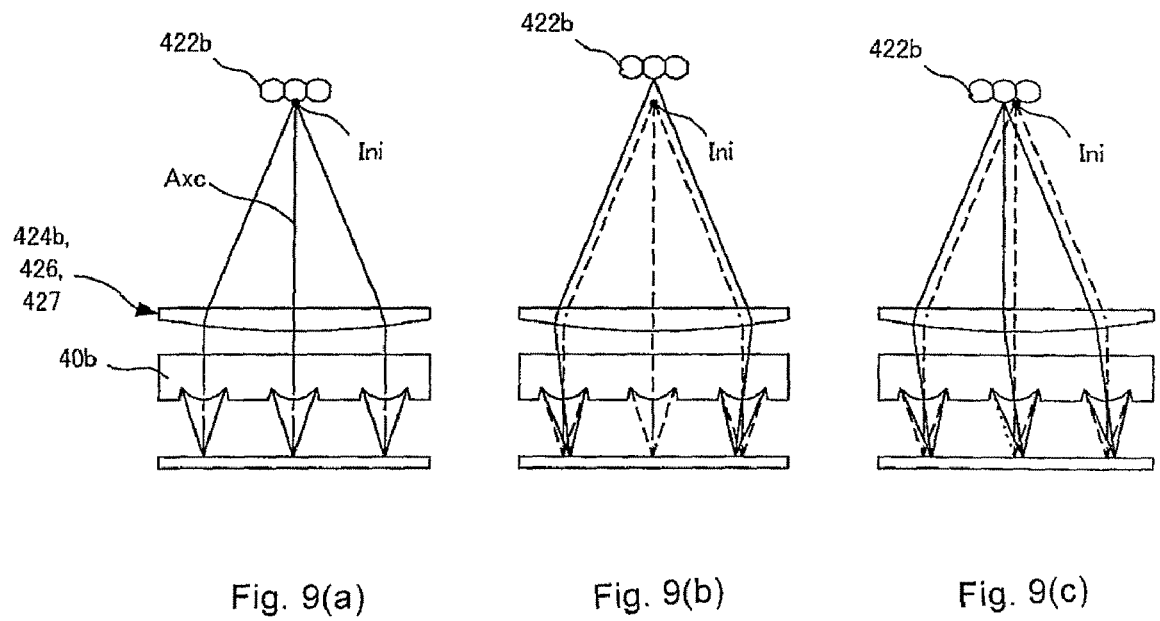
FIG. 9 includes diagrams illustrating magnification control of the light converging pattern.

FIG. 9(a) shows a state in which the fly's eye lens 422b is positioned at a reference position Ini. In FIG. 9(a), the fly's eye lens 422b is positioned at a front focal position. The position of the fly's eye lens 422b in this state is set as the reference position. When the fly's eye lens 422b is positioned at the reference position, the light from the fly's eye lens 422b passes through the condenser lens 424b and re-imaging optical systems (426 and 427) to illuminate the light converging portion formation region 40b with telecentric illumination light (illumination light in a state in which a main light beam of the illumination light is parallel to the optical axis). The illumination light is converged at a plurality of light converging portions of the light converging portion formation region 40b. This forms a light converging pattern at the reference position of the plate P.

FIG. 9(b) shows a state in which the fly's eye lens 422b is moved from the reference position Ini in the direction of the optical axis. In this case, the illumination light to the light converging portion formation region 40b is not in a telecentric state, and the light converging pattern is formed at a position deviated from the reference position of the plate P. The deviated amount of the light converging pattern from the reference position is proportional to the distance from the optical axis Axc. This realizes a state equivalent to when the magnification of the light converging pattern is isotropically changed.

FIG. 9(c) shows a state in which the fly's eye lens 422b is moved in a direction perpendicular to the optical axis from the reference position Ini. In this case, the illumination light to the light converging portion formation region 40b has main beams that are parallel to each other but inclined relative to the optical axis. The light converging pattern formed on the plate P is moved in one direction from the reference position by the same amount. This is equivalent to a state in which the position of the light converging pattern is laterally shifted on the plate P.

In this manner, the isotropic magnification, formation position, and the like of the light converging pattern formed on the plate P are controlled by moving the fly's eye lens 422b and changing the state of telecentricity of the illumination light.

Furthermore, the telecentricity of the illumination light for illuminating the mask pattern region 40a can be controlled by moving the fly's eye lens 422a with the fly's eye lens drive portion 423a. This enables control of the isotropic magnification and the horizontal shift (shift on the plate) of the light pattern position of the light pattern formed on the plate P by the illumination light with the mask pattern region 40a. Therefore, in the second embodiment, the magnification and the position of the light pattern transferred by the mask pattern region 40a, and the magnification and the position of the light converging pattern formed by the light converging portion formation region 40b can be independently controlled even if the mask pattern region 40a and the light converging portion formation region 40b are formed on a single member.

Returning to FIG. 5, a telecentricity detection device for detecting the state of telecentricity of the illumination light is arranged in the reference plate RP on the plate stage PS in the second embodiment. The details of the telecentricity detection device will now be described with reference to FIG. 10.

Figure 10:
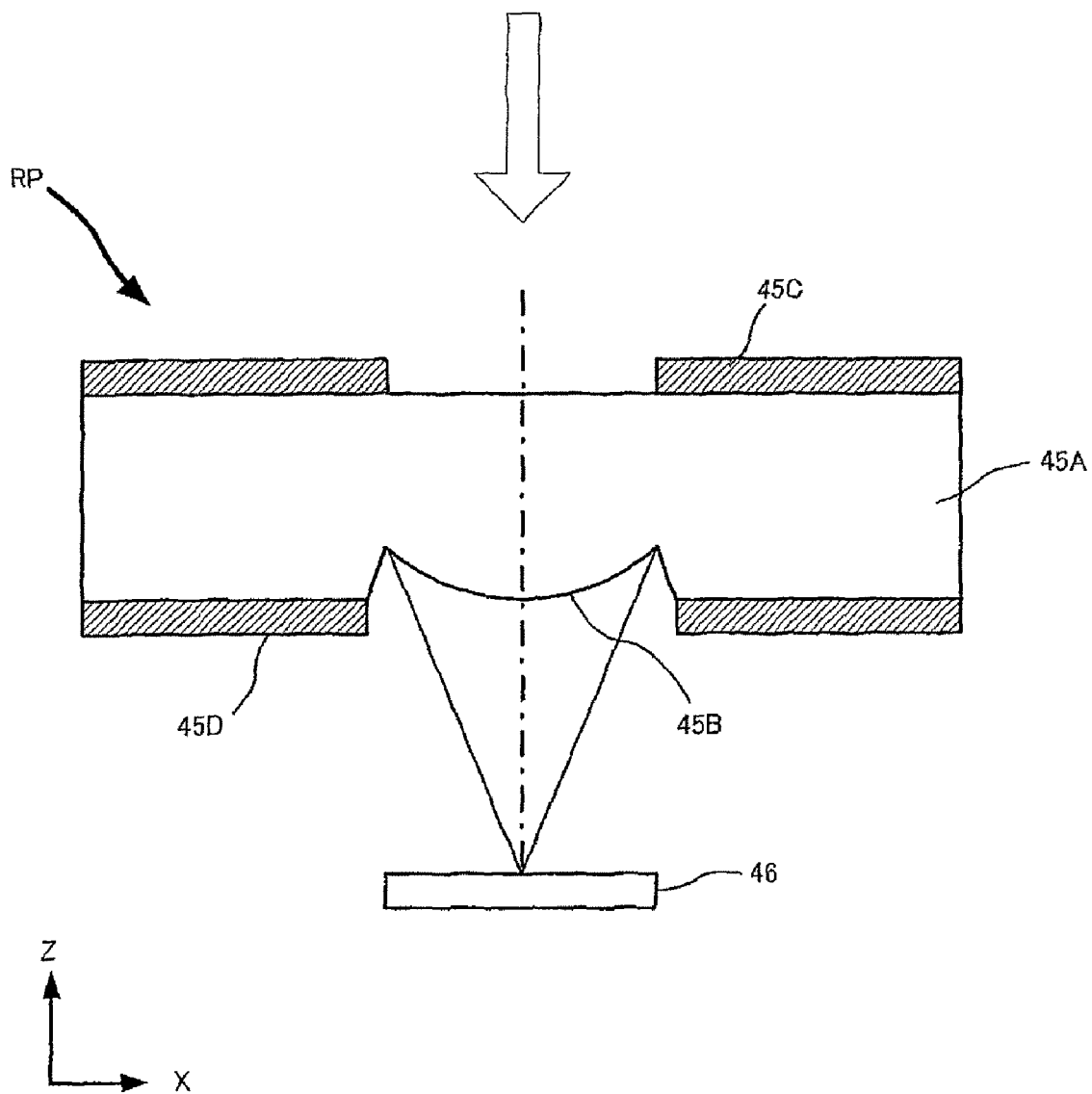
FIG. 10 is a schematic diagram showing the structure of a telecentricity detection device.

FIG. 10 is an XZ cross-sectional view showing a portion of the reference plate RP. In FIG. 10, a condenser lens surface 45B is formed in part of the portion that defines a light transmissive plate 45A, which forms the reference plate RP. The condenser lens surface 45B may be formed on a light entering surface of the light transmissive plate 45A instead of a light emitting surface or may be a diffraction surface instead of a lens surface. A light shield portion 45C is defined around the portion at the light entering side (+Z direction side) corresponding to the condenser lens surface 45B. Incident light is guided to the condenser lens surface 45B through a light transmission region formed by the region excluding the light shield portion 45C, converged by the condenser lens surface 45B, and guided to a photodetector 46 arranged at the rear focal position of the condenser lens surface 45B.

The photodetector 46 may be a two-dimensional CCD that detects a light quantity barycentric position of a light spot converged by the condenser lens surface 45B. The state of telecentricity of the incident illumination light may be measured based on the light quantity barycentric position of a light spot detected by the photodetector 46.

A light shield portion 45D for preventing stray light is formed around the condenser lens surface 45B on the light transmissive plate 45A. The reference mark described above may be formed by the light shield portion 45C on the light entering side of the light transmissive plate 45A.

In the second embodiment, even if non-linear deformation originating from a heat treatment, which is performed during processing, occurs in the plate P, the light pattern may be exposed in accordance with such deformation using the second alignment systems 44A to 44D and the illumination telecentricity control unit. That is, the isotropic magnification change (deformation) amount of the plate P, the magnification component change (deformation) amount in the X direction, the magnification component change (deformation) amount in the Y direction, and the non-linear magnification component change (deformation) amount can be obtained by detecting the alignment mark on the plate P using the second alignment systems 44A to 44D. The light pattern formation position is then obtained in accordance with the obtained magnification change (deformation amount) for every exposure position (e.g., obtained for every position of FIGS. 6(a) to 6(j)). The amount for driving the telecentricity control unit (driving amount of the fly's eye lens drive portions 423a and 423b in the second embodiment) to the obtained light pattern formation position is then determined for each exposure position. During the exposure operation, the exposure is carried out while controlling the state of telecentricity of the illumination light on the mask pattern region 40a and the telecentricity of the illumination light on the light converging portion formation region 40b by the telecentricity control unit for each exposure position. Thus, even if non-linear deformation originating from the heat treatment during the process occurs at the plate P, the light pattern can be exposed in accordance with such deformation.

Figure 11:
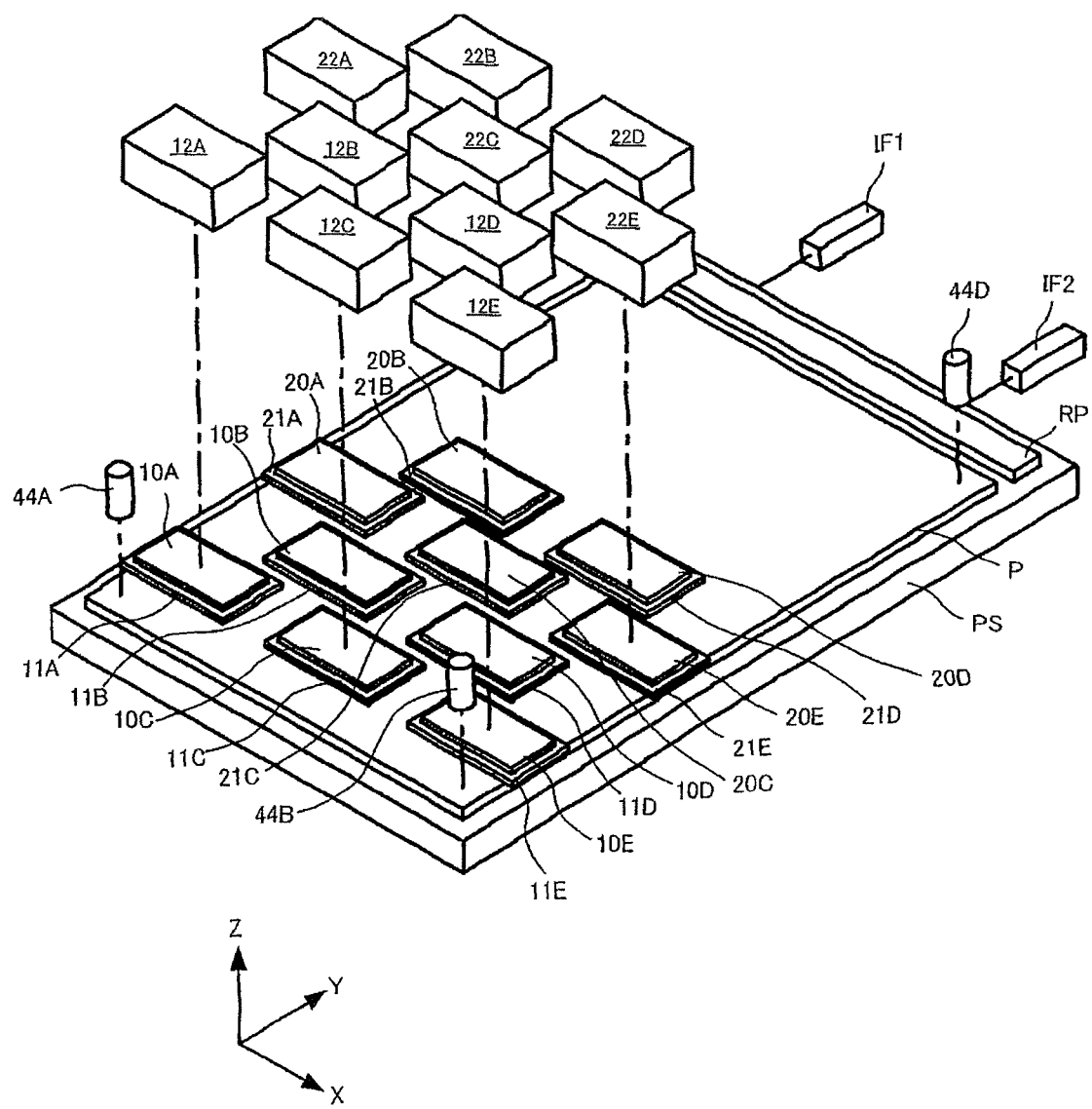
FIG. 11 is a schematic diagram showing an exposure apparatus according to a third embodiment of the present invention.

FIG. 11 is a schematic diagram showing an exposure apparatus according to a third embodiment of the present invention. In FIG. 11, an X axis and a Y axis are set in directions parallel to a plate P, and a Z axis is set in a direction orthogonal to the plate P. More specifically, an XY plane is set to be parallel to a horizontal plane, and a +Z axis is set to be directed upward along a vertical direction.

In above-described second embodiment, exposure is performed on the entire surface of the plate P by repeating movement in steps on the XY plane of the plate P with relative to the light pattern formation member 40 and performing batch exposure. In the third embodiment shown in FIG. 11, exposure is performed on the entire surface of the plate P by laying out a plurality of masks 10A to 10E and light converging pattern formation members 20A to 20E in a staggered manner on a plane substantially parallel to the plate P, and repeating step movement of the plate P in one direction and batch exposure.

In FIG. 11, the plurality of masks 10A to 10E are equivalent to the mask 10 shown in the first embodiment, and the plurality of light converging pattern formation members 20A to 20E are equivalent to the light converging pattern formation member 20 of the first embodiment. Thus, these components will not be described in detail. The masks 10A to 10E are respectively arranged on holding portions 11A to 11E, which holding portions 11A to 11E are arranged to be movable in the Z axis direction and inclinable (pivotal) about the X axis and about the Y axis. The holding portions 11A to 11E are drive controlled by a plurality of actuators (not shown) so that the masks 10A to 10E become parallel to the plate P with a predetermined gap therebetween. The holding portions 11A to 11E serve as the plurality of first holding portions.

The plurality of light converging pattern formation members 20A to 20E are respectively mounted on holding portions 21A to 21E, which are arranged to be movable in the Z axis direction and inclinable (pivotal) about the X axis and the Y axis. The holding portions 21A to 21E are drive controlled by a plurality of actuators (not shown) so that the light converging pattern formation members 20A to 20E become parallel to the plate P with a predetermined gap therebetween. The holding portions 21A to 21E serve as the plurality of second holding portions.

The plurality of illumination portions 12A to 12E respectively supply exposure light to the plurality of masks 10A to 10E and independently control the supplying and stopping of the exposure light. The plurality of illumination portions 22A to 22E respectively supply exposure light to the plurality of light converging pattern formation members 20A to 20E and independently control the supplying and stopping of the exposure light. A telecentricity control unit that is similar to the second embodiment is arranged in the plurality of illumination portions 12A to 12E and 22A to 22E so that the state of telecentricity of the illumination light on the plurality of masks 10A to 10E and the plurality of light converging pattern formation members 20A to 20E can be independently changed.

Furthermore, plate alignment systems 44A to 44D have structures similar to the second alignment systems 44A to 44D of the second embodiment in FIG. 11 and thus will not be described.

The plate P is arranged on the plate stage PS, which is movable in the Y direction as viewed in the drawing. The plate P is movable along the Y direction through drive control of a drive portion (not shown). The reference plate RP is attached at the Y direction end of the plate stage PS. The plate alignment systems 44A to 44D perform position detection and deformation detection of the plate P using the reference plate RP as a reference. Interferometers IF1 and IF2 serve as stage position measurement units for detecting the position of the plate stage PS in the Y direction and in a rotating direction ($\theta z$ direction) of which axis is the Z direction as viewed in the drawing.

Alignment systems (not shown) incorporated in the reference plate RP can be used to detect the positions in the XY plane and the rotating direction ($\theta z$ direction) of which axis is the Z direction of the plurality of the masks 10A to 10E, as well as the positions in the XY plane and the rotating direction ($\theta z$ direction) of which axis is the Z direction of the plurality of light converging pattern formation members 20A to 20.

Figure 12:
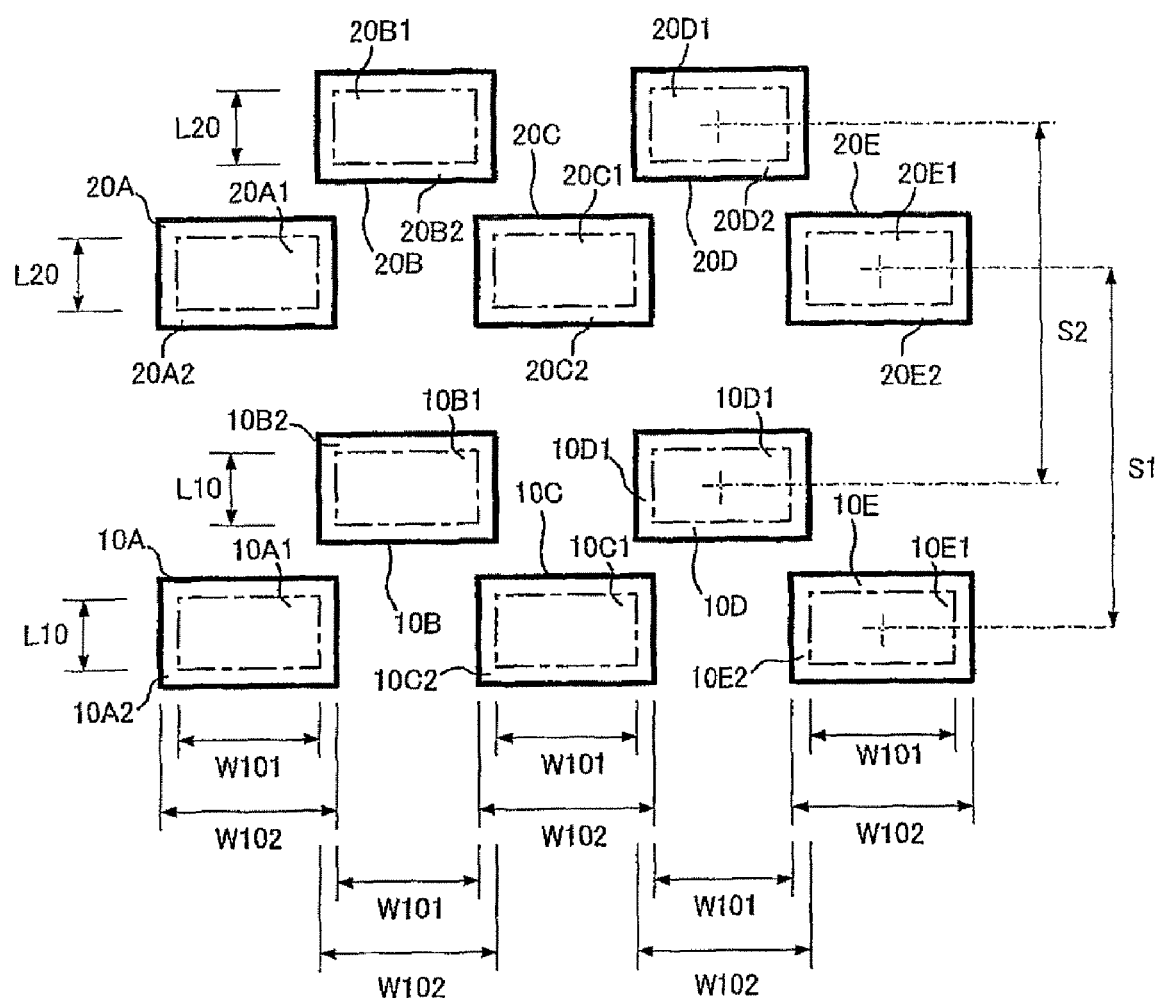
FIG. 12 is a plan view showing the layout of a plurality of masks 10A to 10E and a plurality of light converging pattern formation members 20A to 20E in the third embodiment.

FIG. 12 is a plan view showing the layout of the plurality of masks 10A to 10E and the plurality of light converging pattern formation members 20A to 20E.

In FIG. 12, masks 10A, 10C, and 10E of the plurality of masks 10A to 10E are arranged on the −Y direction side in a first row at a predetermined interval in the X direction, which is orthogonal to the Y direction. The masks 10B and 10D are arranged on the +Y direction side in a second row at a predetermined interval in the X direction, which is orthogonal to the Y direction.

The light converging pattern formation members 20A, 20C, and 20E of the plurality of light converging formation members 20A to 20E are arranged on the −Y direction side in a third row with a predetermined interval in the X direction, which is orthogonal to the Y direction. The light converging pattern formation members 20B and 20D are arranged on the +Y direction side in a fourth row with a predetermined interval in the X direction, which is orthogonal to the Y direction.

The plurality of masks 10A to 10E respectively have first mask pattern regions 10A1 to 10E1 and second mask pattern regions 10A2 to 10E2 formed around the first mask pattern region 10A1 to 10E1. The masks 10A to 10E are laid out so that the second mask pattern regions 10A2 to 10E2 overlap one another in the X direction.

The second mask pattern regions 10A2 to 10E2 are regions that overlap each other on the plate P during the exposure by the masks 10A to 10E and are also referred to as overlap regions.

The interval in the X direction of the masks 10A, 10C, and 10E in the first row is equal to the width W101 in the X direction of the first mask pattern regions (non-overlap regions) 10B1 and 10D1 of the masks 10B and 10D in the second row. The interval in the X direction of the masks 10B and 10D in the second row is equal to the width W101 in the X direction of the mask 10C in the first row.

The plurality of light converging pattern formation members 20A to 20E respectively have third light converging pattern regions 20A1 to 20E1 and fourth light converging pattern regions 20A2 to 20E2 formed around the third light converging pattern regions 20A1 to 20E1. The light converging pattern formation members 20A to 20E are laid out so that the third light converging pattern regions 20A2 to 20E2 overlap one another in the X direction.

The fourth light converging pattern regions 20A2 to 20E2 are regions that overlap each other on the plate P during the exposure by the light converging pattern formation members 20A to 20E and are also referred to as overlap regions.

The interval in the X direction of the light converging pattern formation members 20A, 20C, and 20E in the third row is equal to the width W101 in the X direction of the third light converging pattern regions (non-overlap regions) 20B1 and 20D1 of the light converging pattern formation members 20B and 20D in the fourth row. The interval in the X direction of the light converging pattern formation members 20B and 20D in the fourth row is equal to the width W101 in the X direction of the light converging pattern formation member 20C in the third row. In the third embodiment, the width in the X direction of the first mask pattern region (non-overlap region) of the plurality of masks 10A to 10E and the width in the X direction of the third light converging pattern region (non-overlap region) of the plurality of light converging pattern formation members 20A to 20E are both W101. However, the widths in the X direction of the non-overlap regions of the plurality of masks and the light converging pattern formation members do not need to be equal.

When the number of masks and the light converging pattern formation members is n, the maximum value of the width in the X direction exposed by the mask and the light converging pattern formation member is expressed by:

n×W101+{(n+1)×(W102−W101)/2}.

In the third embodiment, the number of masks and the light converging pattern formation members is five, However, the number is not limited to an odd number and may be any natural number.

In the third embodiment, the regions exposed by the masks 10A, 10C, and 10E in the first row overlap the regions exposed by the light converging pattern formation members 20A, 20C, and 20E in the third row on the plate P as will be described later. In this state, when the length in the Y direction of the first mask pattern regions (non-overlap regions) 10A1, 10C1, and 10E1 of the masks 10A, 10C, and 10E in the first row is L10, and the length in the Y direction of the third light converging pattern regions (non-overlap regions) 20A1, 20C1, and 20E1 of the light converging pattern formation members 20A, 20C, and 20E in the third row is L20, if L1 and L20 are equal, the interval S1 in the Y direction between the first row and the third row satisfy the condition expressed as (where m is an integer other than 0):

S1=m×L10 or S1=m×L20.

The interval in the Y direction between the center of the mask 10A, 10C, and 10E arranged in the first row and the center of the light converging pattern formation member 20A, 20C, and 20E arranged in the third row can be used as the interval S1 in the Y direction between the first row and the third row.

In the same manner, in the third embodiment, the regions exposed by the masks 10B and 10d in the second row overlap the regions exposed by the light converging pattern formation members 20B and 20D in the fourth row on the plate P. In this case, when the length in the Y direction of the first mask pattern regions (non-overlap regions) 10B1 and 10D1 of the masks 10B and 10D in the second row is L10, and the length in the Y direction of the third light converging pattern regions (non-overlap regions) 20B1 and 20D1 of the light converging pattern formation members 20B and 20E in the fourth row is L20, if L10 and L20 are equal, the interval S1 in the Y direction between the second row and the fourth row satisfy the condition (where m is an integer other than 0) of:

S1=m×L10 or S1=m×L20.

The interval in the Y direction between the center of the mask 10B and 10D arranged in the second row and the center of the light converging pattern formation member 20B and 20D arranged in the fourth row can be used as the interval S2 in the Y direction between the second row and the fourth row.

The plurality of masks 10A to 10E and the plurality of light converging pattern formation members 20A to 20E are laid out in the order of the first row, second row, third row, and fourth row along the Y direction in the above description but may be arranged in the order of first row, third row, second row, and fourth row along the Y direction. The order of the first row and the second row is interchangeable, and the order of the third row and the fourth row is also interchangeable.

The exposure operation performed by the exposure apparatus of the third embodiment will now be described with reference to FIG. 13 to FIG. 15. FIGS. 13(a) to 13(c), FIGS. 14(a) to 14(c), and FIG. 15(a) are plan views showing changes in the positional relationship between the plurality of masks 10A to 10E and the plurality of light converging pattern formation members 20A to 20E relative to the plate P during the exposure operation of the exposure apparatus according to the third embodiment. FIGS. 13(d) to 13(f), FIGS. 14(d) to 14(f), and FIG. 15(b) are views showing the exposure field on the plate P exposed in accordance with the procedures of FIGS. 13(a) to 13(c), FIGS. 14(a) to 14(c), and FIG. 15(a).

Alignment of the plurality of masks 10A to 10E and the plurality of light converging pattern formation members 20A to 20E relative to the plate P is performed before the exposure operation.

Figure 13A:
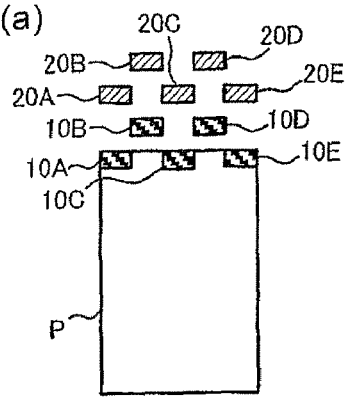
FIGS. 13(a) to 13(c) are plan views showing changes in the positional relationship between the plurality of masks 10A to 10E and the plurality of light converging pattern formation members 20A to 20E relative to the plate P during exposure operations of the exposure apparatus in the third embodiment.
Figure 13D:
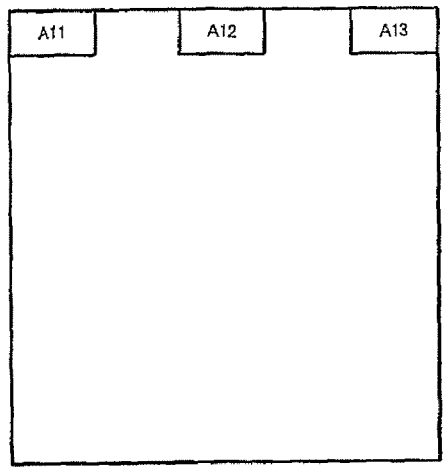
FIGS. 13(d) to 13(f) are diagrams showing exposure fields on the plate P exposed in accordance with the procedures of FIGS. 13(a) to 13(c)

As shown in FIG. 13(a), the plate stage PS is first drive controlled so that the masks 10A, 10C, and 10E overlap the plate P. Then, the masks 10A, 10C, and 10E are irradiated with exposure light by the illumination portions 12A, 12C, and 12E. As shown in FIG. 13(d), such batch exposure operation forms exposure fields A11, A12, and A13 on the plate P.

Figure 13B:
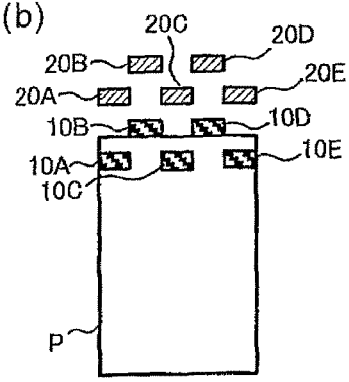
Figure 13E:
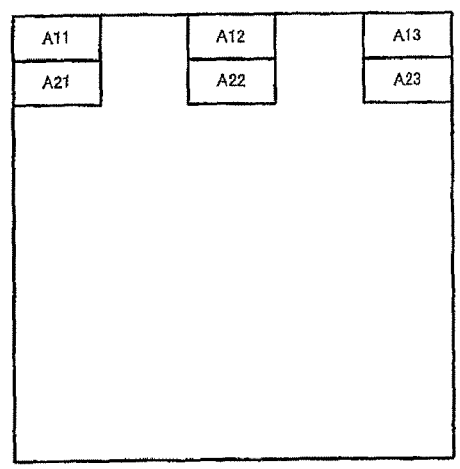

Subsequently, as shown in FIG. 13(b), the plate stage PS performs a step movement in the −Y direction so that the masks 10A, 10C, and 10E become adjacent to the −Y direction side of the exposure fields A11, A12, and A13. The masks 10A, 10C, and 10E are irradiated with exposure light by the illumination portions 12A, 12C, and 12E. Exposure fields A21, A22, and A23 adjacent to the exposure fields A11, A12, and A13 at the −Y direction side are then formed on the plate P by the exposure light through the masks 10A, 10C, and 10E, as shown in FIG. 13(e). The portion on the −Y direction side formed by the second mask pattern regions 10A2, 10C2, and 10E2 of the masks 10A, 10C, and 10E in the exposure fields A11, A12, and A13 overlap the portion on the +Y direction side formed by the second mask pattern regions 10A2, 10C2, and 10E2 of the masks 10A, 10C, and 10E in the exposure fields A21, A22, and A23 on the plate P.

Figure 13C:
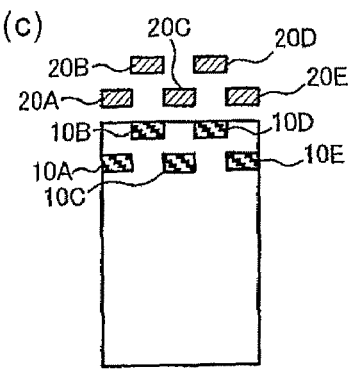
Figure 13F:
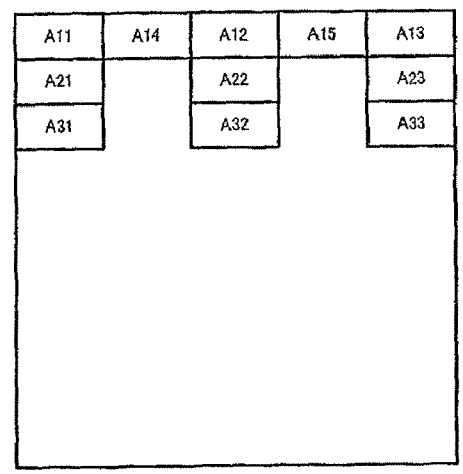

Then, as shown in FIG. 13(c), the plate stage PS performs a step movement in the −Y direction so that the masks 10A, 10C, and 10E become adjacent to the −Y direction side of the exposure fields A21, A22, and A23 and the masks 10B and 10D are positioned between the exposure fields A11, A12, and A13. The masks 10A, 10C, and 10E are irradiated with exposure light by the illumination portions 12A, 12C, and 12E, and the masks 10B and 10D are irradiated with exposure light by the illumination portions 12B and 12D. The exposure fields A31, A32, and A33 adjacent to the exposure fields A21, A22, and A23 in the −Y direction side are then formed on the plate P by the exposure light through the masks 10A, 10C, and 10E, and the exposure fields A14 and A15 positioned between the exposure fields A11, A12, and A13 are formed by the exposure light through the masks 10B and 10D, as shown in FIG. 13(f).

The portion at the −Y direction side formed by the second mask pattern regions 10A2, 10C2, and 10E2 of the masks 10A, 10C, and 10E in the exposure fields A21, A22, and A23 overlap the portion at the +Y direction side formed by the second mask pattern regions 10A2, 10C2, and 10E2 of the masks 10A, 10C, and 10E in the exposure fields A31, A32, and A33 on the plate P.

The portion at the −X direction side formed by the second mask pattern region 10B2 of the mask 10B in the exposure field A14 overlaps the portion at the +X direction side formed by the second mask pattern region 10A2 of the mask 10A in the exposure field A11. The portion at the +X direction side formed by the second mask pattern region 10B2 of the mask 10B in the exposure field A14 overlaps the portion on the −X direction side formed by the second mask pattern region 10C2 of the mask 10C in the exposure field A12.

In the same manner, the portion at the −X direction side formed by the second mask pattern region 10D2 of the mask 10D in the exposure field A15 overlaps the portion at the +X direction side formed by the second mask pattern region 10C2 of the mask 10C in the exposure field A12. The portion at the +X direction side formed by the second mask pattern region 10D2 of the mask 10D in the exposure field A15 overlaps the portion at the −X direction side formed by the second mask pattern region 10C2 of the mask 10C in the exposure field A13.

As shown in FIG. 14(a), the plate stage PS performs a step movement in the −Y direction so that the masks 10A, 10C, and 10E become adjacent to the −Y direction side of the exposure fields A31, A32, and A33 and the masks 10B and 10D become adjacent to the −Y direction side of the exposure fields A14 and A15. Further, the masks 10A to 10E are irradiated with exposure light by the illumination portions 12A to 12E. Such batch exposure operation forms exposure fields A41 to A43, A24, and A25 on the plate P, as shown in FIG. 14(d).

Subsequently, as shown in FIG. 14(b), the plate stage PS performs a step movement in the −Y direction so that the masks 10A, 10C, and 10E become adjacent to the −Y direction side of the exposure fields A41, A42, and A43 and the masks 10B and 10D become adjacent to the −Y direction side of the exposure fields A24 and A25. The light converging pattern formation members 20A, 20C, and 20E overlap the exposure fields A11, A12, and A13.

After such step operation, the masks 10A to 10E are irradiated with exposure light by the illumination portions 12A to 12E, and the light converging pattern formation members 20A, 20C, and 20E are irradiated with exposure light by the illumination portions 22A, 22C, and 22E. Such batch exposure operation forms exposure fields A51 to A53 and A34 and A35 on the plate P and forms exposure fields B11 to B13 so as to overlap the regions of the exposure fields A11 to A13, as shown in FIG. 14(e).

Then, as shown in FIG. 14(c), the plate stage PS performs a step movement in the −Y direction so that the masks 10A, 10C, and 10E become adjacent to the −Y direction side of the exposure fields A51, A52, and A53, the masks 10B and 10D become adjacent to the −Y direction side of the exposure fields A34 and A35, and the light converging pattern formation members 20A, 20C, and 20E become adjacent to the −Y direction side of the exposure fields B11 (A11), B12 (A12), and B13 (A13), and the masks 10A to 10E and the light converging pattern formation members 20A, 20C, and 20E are irradiated with exposure light by the illumination portions 12A to 12E, 22A, 22C, and 22E. In such batch exposure, the exposure fields A61 to A63, A44, and A45 are formed on the plate P. Further, exposure fields B21 to B23 are formed so as to overlap the regions of the exposure fields A21 to A23, as shown in FIG. 14(f).

Figures 15A, 15B:
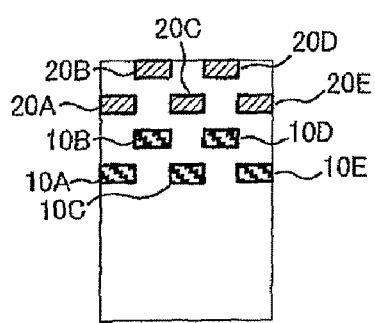
FIG. 15(a) is a plan view showing changes in the positional relationship between the plurality of masks 10A to 10E and the plurality of light converging pattern formation members 20A to 20E relative to the plate P during exposure operations of the exposure apparatus in the third embodiment.
FIG. 15(b) is a diagram showing exposure fields on the plate P exposed in accordance with the procedure of FIG. 15(a)

After performing the batch exposure operation, the plate stage PS performs step movement in the −Y direction so that the masks 10A, 10C, and 10E become adjacent to the −Y direction side of the exposure fields A61 to A63 and the masks 10B and 10D become adjacent to the −Y direction side of the exposure fields A34 and A35, as shown in FIG. 15(a). The light converging pattern formation members 20A, 20C, and 20E overlap the exposure fields A31, A32, and A33, and the light converging pattern formation members 20B and 20D overlap the exposure fields A14 and A15. Thereafter, the masks 10A to 11E and the light converging pattern formation members 20A to 20E are irradiated with exposure light by the illumination portions 12A to 12E and 22A to 22E.

As shown in FIG. 15(b), such batch exposure operation forms exposure fields A71 to A74, A54, and A55 on the plate P. Further, the exposure fields B31 to B33 are formed to overlap the region of the exposure fields A31 to A33, and exposure fields B14 and B15 are formed to overlap the region of the exposure fields A14 and A15.

The step movements in the Y direction and the batch exposure operation are repeated to perform exposure on the plate P.

In this manner, the exposure apparatus of the third embodiment uses the plurality of masks 10A to 10E, which are arranged in a staggered manner, and the plurality of light converging pattern formation members 20A to 20E, which are arranged in a staggered manner. Thus, the masks 10A to 10E and the light converging pattern formation members 20A to 20E can be miniaturized with respect to the plate P. Furthermore, the cost of the masks 10A to 10E and the light converging pattern formation members 20A to 20E can be reduced. In addition, the influence of deflection, which is caused by gravitational force on the masks 10A to 10E and the light converging pattern formation members 20A to 20E, can be reduced, and light pattern exposure can be performed with high accuracy.

Further, in the third embodiment, the deformed amount of the plate P can be obtained by detecting an alignment mark on the plate P using the plate alignment systems 44A to 44D in the same manner as in the second embodiment. In accordance with the obtained deformed amount, the state of telecentricity of the illumination light can be controlled by the telecentricity control unit of the illumination portions 12A to 12E and 22A to 22E. Accordingly, even if a nonlinear deformation caused by heat treatment during the process occurs at the plate P, the light pattern can be exposed in accordance with such deformation.

The plate P is still during the exposure of the plate P in the first to the third embodiments. However, in a modification, exposure can be performed while moving the plate P.

Figure 16:
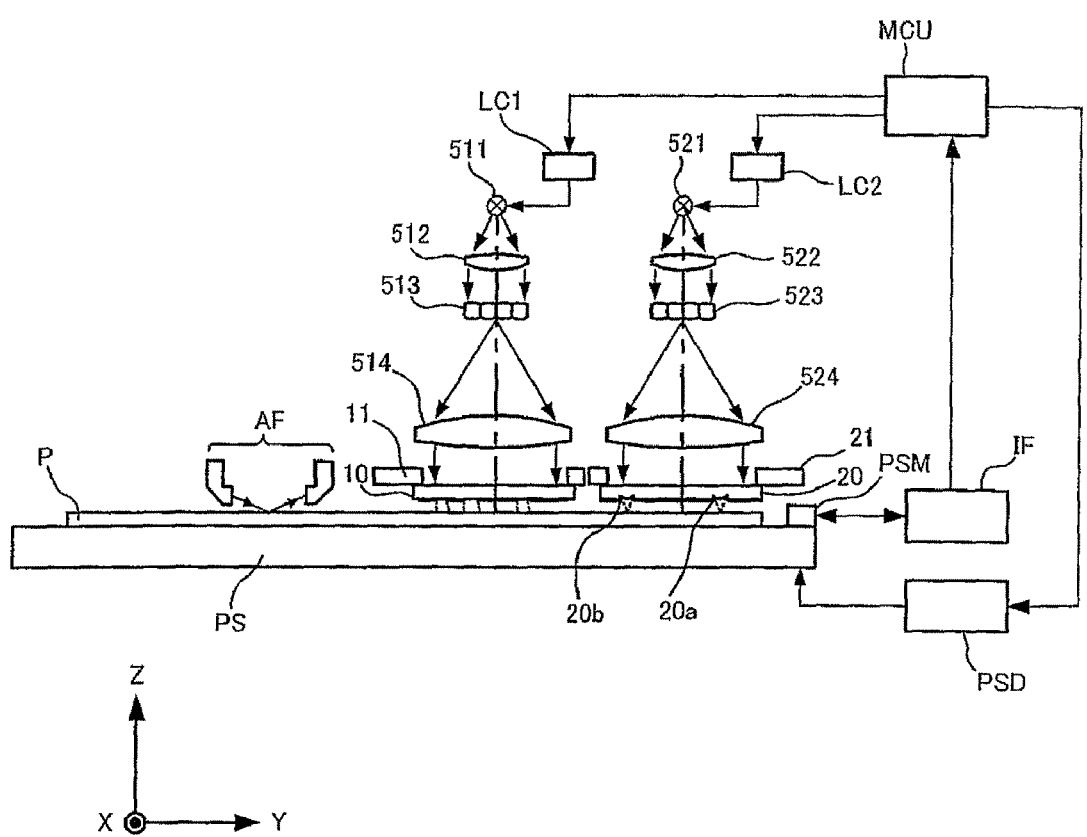
FIG. 16 is a schematic diagram showing the structure of an exposure apparatus according to a sixth modification.

FIG. 16 is a schematic diagram view showing the structure of a sixth modification of an exposure apparatus that performs exposure while moving the plate P. In FIG. 16, an X axis and a Y axis are set in directions parallel to a plate P, and a Z axis is set in a direction orthogonal to the plate P. More specifically, an XY plane is set to be parallel to a horizontal plane, and a +Z axis is set to be directed upward along a vertical direction.

FIG. 16 shows a modification of the first embodiment, and same reference numerals are denoted for members having the same function as in the first embodiment shown in FIG. 1.

In FIG. 16, an illumination portion supplies exposure light to a mask 10, which is held by a first holding portion 11. The illumination portion includes a light source 511, an input lens 512, an optical integrator 513 such as a fly's eye lens, and a condenser lens 514. A light emission controller LC1 controls the light source 511 to start and stop the emission of light. The input lens 512 converges exposure light from the light source 511. The optical integrator 513 forms a secondary light source based on the exposure light from the input lens 512. The condenser lens 514 guides the light from the secondary light source formed by the optical integrator 513 to the mask.

The illumination portion for supplying exposure light to a light converging pattern formation member 20, which is held by the second holding portion 21, has a structure similar to the illumination portion for supplying exposure light to the mask 10 and thus will not be described here.

Light emission controllers LC1 and LC2, which respectively control light sources 511 and 521 to start and stop the emission of light, are connected to a main control unit MCU. An interferometer IF, which serves as a stage position measurement unit for detecting the position in the XY plane of the plate stage PS, and a plate stage drive unit PSD, which drives the plate stage PS are connected to the main control unit MCU.

In the exposure apparatus according to the sixth modification, a plane position detection device AF for detecting a position in a ±Z direction of the plate P is arranged, where the position in the ±Z direction of the plate P, and furthermore, the interval between the mask 10 and the plate P as well as the interval between the light converging pattern formation member 20 and the plate P are constantly measured by the plane position detection device AF. A drive portion (not shown) connected to the first holding portion to change the position in the ±Z direction of the mask 10 is controlled, and a drive portion (not shown) connected to the second holding portion to change the position in the ±Z direction of the light converging pattern formation member 20 is controlled based on the measurement result to adjust the position in the ±Z direction of the mask 10 and the light converging pattern formation member 20. Thus, the light converging pattern by the plurality of light converging portions of the light converging pattern formation member 20 can be formed without being defocused, and thus high accuracy exposure can be achieved.

The exposure operation performed by the exposure apparatus of to the sixth modification will be simply described. Although not shown in FIG. 16, the alignment systems of the second embodiment or the third embodiment are also arranged in the exposure apparatus of the sixth modification. The mask 10, the light converging pattern formation member 20, and the plate P are aligned before the exposure operation.

In the exposure apparatus of the sixth modification, the main control unit MCU moves the plate stage PS in the Y direction with the plate stage drive unit PSD. The XY coordinates of the plate stage PS is constantly monitored by the main control unit MCU with the interferometer IF. The main control unit MCU has the light source 511 instantaneously emit light with the light emission controller LC1 at the instant a predetermined exposure field on the plate P overlaps the mask 10. More specifically, the main control unit MCU emits light from the light source 511 with the light emission controller LC1 and exposes the pattern on the mask 10 onto the plate P at the instant the XY coordinates of the plate stage PS match the coordinates at which the predetermined exposure field on the plate P overlaps the mask 10.

Further, the main control unit MCU has the light source 521 instantaneously emit light with the light emission controller LC2 at the instant a region (exposure region) in which a light pattern is formed by the light converging pattern formation member 20 overlaps the above predetermined exposure field that has been subjected to exposure by the mask 10. This performs exposure so as to overlap the light pattern onto the predetermined exposure field through the light converging pattern formation member 20.

The main control unit MCU has the light source 511 instantaneously emit light with the light emission controller LC1 at the instant the mask 10 overlaps a further exposure field that is adjacent in the Y direction to the predetermined exposure field that has been subjected to exposure by the mask 10. This exposes the pattern of the mask 10 onto the further exposure field.

The exposure onto the plate P is completed by performing the above operations on the entire surface of the plate P.

A laser light source, such as a semiconductor laser or a harmonic laser that emit light of an ultraviolet range, or an ultraviolet light emission diode (ultraviolet LED) may be used as the light sources 511 and 521 in the sixth modification.

The sixth modification has an advantage in that the throughput is increased since exposure is performed without stopping the plate P.

In the above-described sixth modification, the main control unit MCU controls the light emission controllers LC1 and LC2 at the instant the mask 10 or the light converging pattern formation member 20 overlaps the exposed field. However, if there is a time delay from voltage application to the light sources 511 and 521 to light emission, the main control unit MCU may control the light emission controllers LC1 and LC2 taking into consideration the delay.

The sixth modification shown in FIG. 16 is a modification of the first embodiment. However, the second embodiment and the third embodiment may be modified in accordance with the present disclosure.

Figure 17:
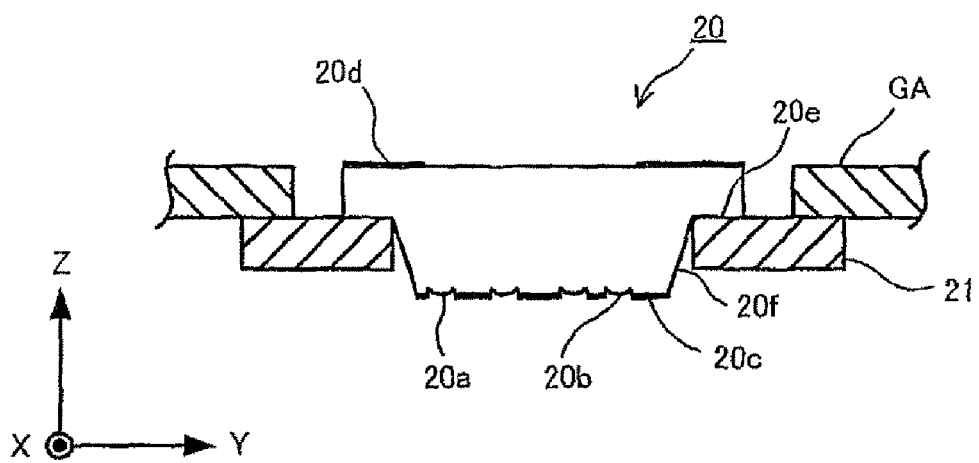
FIG. 17 is a schematic diagram showing the structure of first and second holding portions in an exposure apparatus according to a seventh modification.

FIG. 17 shows a seventh modification in which the first holding portion 11 or the second holding portion 21 for holding the mask 10 or the light converging pattern formation member 20 is deformed. In FIG. 17, an X axis and a Y axis are set in directions parallel to a plate P, and a Z axis is set in a direction orthogonal to the plate P. More specifically, an XY plane is set to be parallel to a horizontal plane, and a +Z axis is set to be directed upward along a vertical direction. In FIG. 17, the same reference numerals are denoted for members having the same function as in the embodiments and the modifications described above.

Only the second holding portion for holding the light converging pattern formation member 20 is shown in FIG. 17. However, the first holding portion for holding mask 10 has a similar structure.

In FIG. 17, a plurality of light converging portions 20a and 20b and a light shield portion (light reduction portion) 20c are formed on the lower surface side (emission surface side) of the light converging pattern formation member 20. A light shield portion (light reduction portion) 20d for reducing generation of harmful light such as flare light is formed at the peripheral part of the upper surface side (incident surface side). A held surface 20e that may contact the second holding portion 21 is formed between the upper surface (incident surface) and lower surface (emission surface) of the light converging pattern formation member 20. A side surface extending from the held surface 20e to the emission surface is tapered so as to narrow towards the lower surface.

In the seventh modification, the held surface 20e is located closer to the incident surface than the plurality of light converging portions 20a and 20b. Thus, the distance (operating distance) between the plurality of light converging portions 20a and 20b and the plate P can be shortened even when the light converging pattern formation member 20 is held from the lower side.

A fourth embodiment will now be described with reference to FIGS. 18 and 19. FIG. 18 includes schematic views showing the structure of an exposure apparatus according to the fourth embodiment, where FIG. 18(a) is a perspective view showing the entire exposure apparatus, and FIG. 18(b) is a diagram showing a variable light spot generation unit. FIG. 19 includes diagrams showing an exposure operation performed by the exposure apparatus of the fourth embodiment. In FIGS. 18 and 19, an X axis and a Y axis are set in directions parallel to a plate P, and a Z axis is set in a direction orthogonal to the plate P. More specifically, an XY plane is set to be parallel to a horizontal plane, and a +Z axis is set to be directed upward along a vertical direction. In FIGS. 18 and 19, same reference numerals are denoted for members having the same function as the embodiments and the modifications described above.

The exposure apparatus of to the fourth embodiment has the plurality of light converging pattern formation members 20A to 20E of the third embodiment shown in FIG. 11 replaced with variable light spot generation units 200A to 200E.

As shown in FIG. 18(a), in the exposure apparatus of the fourth embodiment, a plurality of masks 10A to 10C respectively held by first holding portions 11A to 11C are arranged in a staggering manner in the XY plane. Specifically, the masks 10A and 10C of the plurality of masks 10A to 10C are arranged on the −Y direction side in a first row at a predetermined interval in the X direction, which is orthogonal to the Y direction. The mask 10B is arranged on the +Y direction side in a second row at a predetermined interval in the X direction orthogonal to the Y direction.

In the exposure apparatus of the fourth embodiment, the plurality of variable light spot generation units 200A to 200E are arranged in a staggering manner on the +Y direction side of the plurality of masks 10A to 10C. Specifically, the masks 200A, 200C, 200E, and 200G of the plurality of variable light spot generation units 200A to 200E are arranged on the −Y direction side in a first row at a predetermined interval in the X direction, which is orthogonal to the Y direction. The variable light spot generation units 200B, 200D, and 200F are arranged on the +Y direction side in a second row at a predetermined interval in the X direction.

FIG. 18(b) is a schematic diagram showing the structure of the variable light spot generation unit. Only the structure of one variable light spot generation unit 200A will be described here. The structure of the other variable light spot generation units 200B to 200G are the same as the variable light spot generation unit 200A and thus will not be described.

In FIG. 18(b), the variable light spot generation unit 200A includes a light converging pattern formation portion 220A formed by a plurality of light converging portions such as a two-dimensional micro lens array, an illumination portion 222A for supplying exposure light, and a spatial light modulator 223A such as digital micro mirror (DMD) array. A beam splitter 224A for guiding the exposure light from the illumination portion 222A to the spatial light modulator 223A and for guiding the exposure light from the spatial light modulator 223A to the light converging pattern formation portion 220A is arranged in an optical path between the spatial light modulator 223A and the light converging pattern formation portion 220A.

A light modulation surface of the spatial light modulator 223A and an incident surface of the light converging pattern formation portion 220A are optically conjugated by relay optical systems 225A and 226A, which are arranged in the optical path between the spatial light modulator 223A and the light converging pattern formation portion 220A. The spatial light modulator 223A individually controls the starting and stopping of the exposure light supplied to each light converging portion (each lens in the two-dimensional microlens array) of the light converging pattern formation portion 220A. That is, light is selectively irradiated onto each light converging portion. This forms a light spot on the plate P only at the light converging portion to which the exposure light reflected by the spatial light modulator 223A has reached. That is, ON/OFF of the light spot formed on the plate P can be controlled by the spatial light modulator, and an arbitrary light pattern can be formed on the plate P.

The light converging pattern formation portion 220A is held by a housing 227A. The housing 227A serves as a second holding portion for holding the light converging pattern formation member. The housing 227A accommodates the spatial light modulator 223A, the beam splitter 224A, and the relay optical systems 225A and 226A.

The maximum range of the exposure field formed on the plate P by each of the variable light spot generation units 200A to 200E is set so that the exposure regions only partially overlap each other in the X direction.

The exposure operation in the exposure apparatus of the fourth embodiment will now be described with reference to FIG. 19. FIG. 19 includes diagrams showing the state of the plate P during the exposure operation performed by the exposure apparatus of the fourth embodiment.

The plurality of masks 10A to 10C and the plurality of variable light spot generation units 200A to 200E are aligned with the plate P before the exposure operation. Each of the embodiments described above can be referred to for the alignment of the plurality of masks 10A to 10C and the plate P. The disclosure of International Patent Publication No. WO2006/080285 and the corresponding U.S. Patent Publication No. 2007/0296936 can be referred to for the alignment of the plurality of variable light spot generation units 200A to 200E and the plate P. U.S. Patent Publication No. 2007/0296936 is incorporated herein by reference.

To simplify the description, in FIG. 19, only the mask 10A of the plurality of masks is illustrated and only the variable light spot generation unit 200A of the plurality of variable light spot generation units 200A to 200E is illustrated. The following description focuses on the mask 10A and the variable light spot generation unit 200A.

First, as shown in FIG. 19(a), the plate stage PS is drive controlled so that the mask 10A overlaps region PA1 on the plate P. Then, the mask 10A is irradiated with exposure light by the illumination portion 12A. Such batch exposure operation transfers the pattern of the mask 10A as a latent image to the region PA1 of the plate P.

The plate stage PS is then moved in the +Y direction as viewed in the drawing so that the mask 10A overlaps a region PA2 of the plate P. As shown in FIGS. 19(b) to 19(e), light spot exposure is performed on the region PA1 of the plate P by the variable light spot generation unit 200A during the movement of the plate stage PS, that is, during the movement of the plate P. Such scanning light spot exposure overlaps the light spot of the variable light spot generation unit 200A with is the latent image formed by the mask 10A formed in the region PA1 of the plate P.

As shown in FIG. 19(f), the illumination portion 12A irradiates the mask 10A with exposure light. Such batch exposure operation transfers the pattern of the mask 10A as a latent image to the region PA2 of the plate P.

The operation of performing the light spot exposure with the variable light spot generation unit 200A while moving the plate P in the +Y direction and the operation of performing batch exposure with the mask 10A are repeated to expose the entire surface of the plate P.

In this manner, in the exposure apparatus according to the fourth embodiment, the light spot exposure with the variable light spot generation units 200A to 200E can be performed on the exposure fields exposed by the plurality of masks 10A to 10C. The scanning light spot exposure with the variable light spot generation units 200A to 200E may be performed during a step operation of moving the region on the plate relative to the mask 10A to 10C. This increases the throughput.

Such variable light spot generation units 200A to 200E are known to be used in a mask-less exposure apparatus. However, an increase in the pattern data amount of the light pattern exposed onto the plate P would increase the cost for forming a control system for processing the enormous amount of pattern data and a transfer circuit for transferring the pattern data from the control system to the spatial light modulator. Furthermore, limitations resulting from the data transfer speed of a transfer circuit that transfers the enormous amount of pattern data would hinder an increase of the throughput.

Comparatively, in the fourth embodiment, the amount of pattern data used by the variable light spot generation units 200A to 200E is extremely small. Thus, the fourth embodiment is advantageous in that the throughput does not decrease even when lowering the cost of the control system and the transfer circuit.

When using the exposure apparatus of the fourth embodiment to manufacture a flat panel display, such as liquid crystal display device, exposure may be performed on a display peripheral by using only the variable light spot generation units 200A to 200E.

The fourth embodiment may be modified by referring to the sixth modification to performed exposure while moving the plate P when performing exposure on the plate P with the masks 10A to 10C.

In the exposure apparatuses of the first to the fourth embodiments and the modifications described above, a flexible sheet-like plate such as a light transmissive resin may be used as the plate P in lieu of a light transmissive plate such as glass. In this case, a mechanism for moving the sheet-like plate (typically, a conveying mechanism such as feeding roller around which a roll of a pre-processed sheet-like plate is wound, a roller or sprocket for transporting the sheet-like plate fed from the feeding roller, and a winding roller around which a roll the processed sheet-like plate is wound) relative to the first and second holding portions may serve as a plate stage.

The exposure apparatuses of the first to the fourth embodiments and the modifications described above may be manufactured through the following procedures. First, the first holding portion for holding the mask and the second holding portion for holding the light converging pattern formation member, as well as the illumination portion for irradiating the mask with exposure light and the light converging pattern formation member are prepared as a subsystem. The first holding portion and the second holding portion are then assembled near a plate stage an which a plate is held. The illumination portion is assembled so that the mask and the light converging pattern formation member held by the first holding portion and the second holding portion can be irradiated with exposure light. During the assembly, the subsystem is assembled so as to maintain a predetermined mechanical accuracy, electrical accuracy, and optical accuracy. To ensure such various types of accuracies, adjustments for obtaining optical accuracy for various optical systems, adjustments for obtaining mechanical accuracies for various mechanical systems, and adjustments for obtaining electrical accuracies for various electrical systems are performed before and after the assembly. After the process of assembling the subsystem to the exposure apparatus ends, total adjustments are performed, and various types of accuracies for the exposure apparatus as a whole are ensured. It is desirable that the exposure apparatus be manufactured in a clean room where the temperature, cleanness, and the like are managed.

A liquid crystal display device serving as a micro-device can be obtained by forming a predetermined pattern (circuit pattern, electrode pattern, etc.) on a photosensitive plate (glass plate) using the exposure apparatus of the first to fourth embodiments or the modifications. One example of such a manufacturing method will be described with reference to FIGS. 20 to 30.

Figure 20:
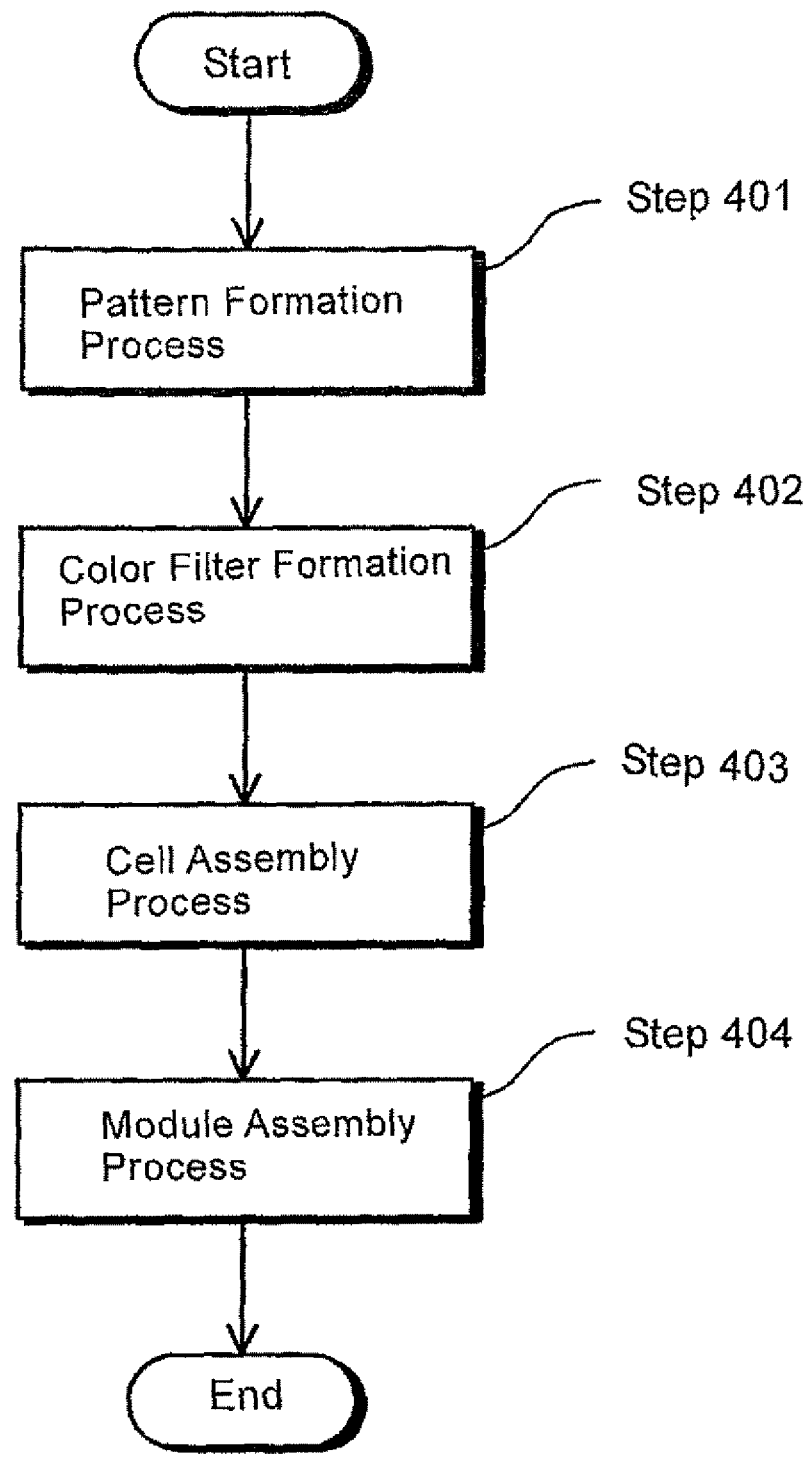
FIG. 20 is a flowchart illustrating a device manufacturing method according to a fifth embodiment.

In step S401 (pattern formation process) of FIG. 20, an application process for preparing a photosensitive plate by applying a photoresist to a plate subject to exposure, an exposure process for transferring and exposing the pattern of the liquid crystal display device mask on the photosensitive plate using the exposure apparatus according to one of the first to fourth embodiments and modifications, and a development process for developing the photosensitive plate are performed. A predetermined resist pattern is formed on the plate by a lithography process including the application process, the exposure process, and the development process. After the lithography process, a predetermined pattern including many electrodes etc. is formed on the plate through an etching process that uses the resist pattern as a mask, a resist removal process, and the like. The lithography process and the like are executed over a number of times in accordance with the number of layers on the plate. A thin-film transistor plate is formed on the plate without undergoing the lithography processes.

A process for manufacturing a thin-film transistor plate in the method for manufacturing a flat panel display in the fifth embodiment will be described in detail with reference to FIGS. 21 to 30.

First, a first stage of a process for manufacturing a thin-film transistor plate will be described with reference to FIG. 21.

Figure 21A:
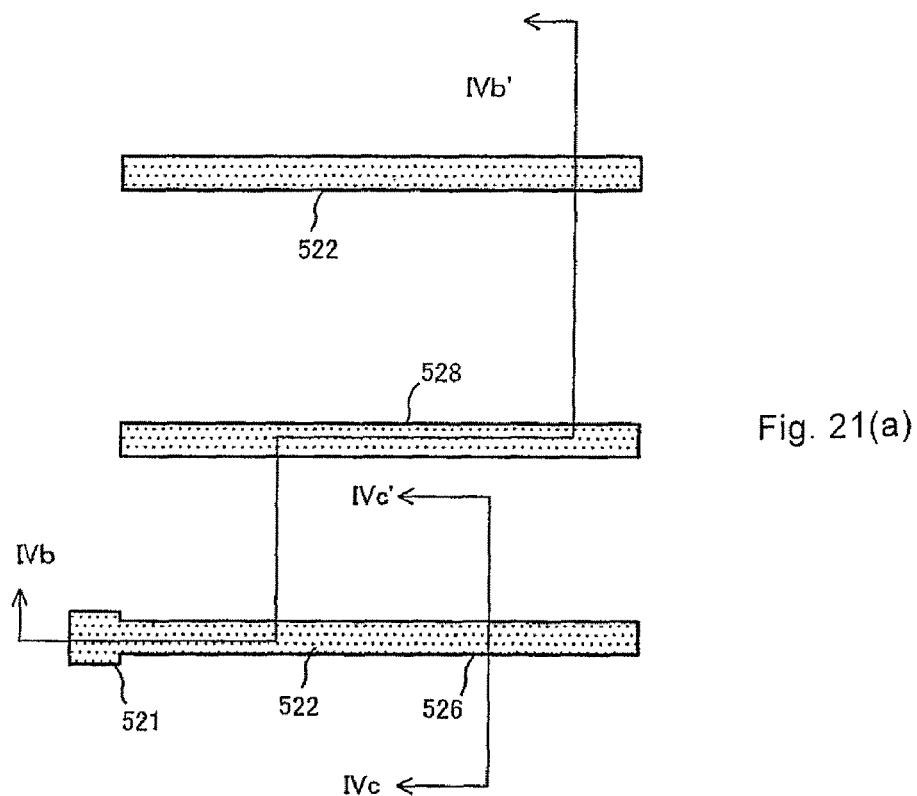
FIG. 21(a) is a layout diagram.
Figure 21B:
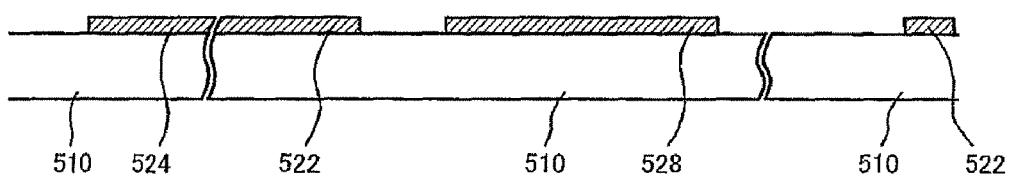
FIG. 21(b) is a cross-sectional view taken along line IVb-IVb' in the layout diagram of FIG. 21(a)
Figure 21C:
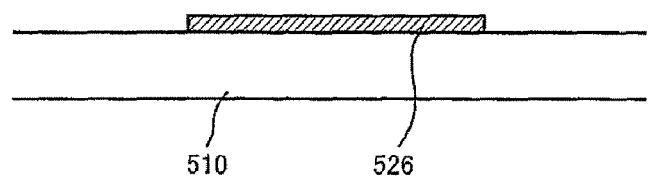
FIG. 21(c) is a cross-sectional view taken along line IVc-IVc' in the layout diagram of FIG. 21(a)

FIG. 21(a) is a layout diagram showing a thin-film transistor plate in a first stage of a process for manufacturing the thin-film transistor plate, FIG. 21(b) is a cross-sectional view taken along line IVb-IVb' in the layout diagram of FIG. 21(a), and FIG. 21(c) is a cross-sectional view taken along line IVc-IVc' in the layout diagram of FIG. 21(a).

As shown in FIG. 21, a conductor layer such as metal is first vapor deposited on a plate 510 (plate P) to a thickness of 1000 Å to 3000 Å through methods such as sputtering. Then, a photosensitive film is applied to the plate 510. Afterwards, the photosensitive film is exposed using a mask having a pattern that corresponds to the circuit pattern shown in the layout diagram of FIG. 21(a), and the photosensitive film is developed. Thereafter, dry or wet etching is performed using the developed photosensitive film as the mask. This forms a gate wiring including a gate line 522, a gate pad 524, a gate electrode 526, and a sustain electrode 528 on the plate 510.

Figure 22A:
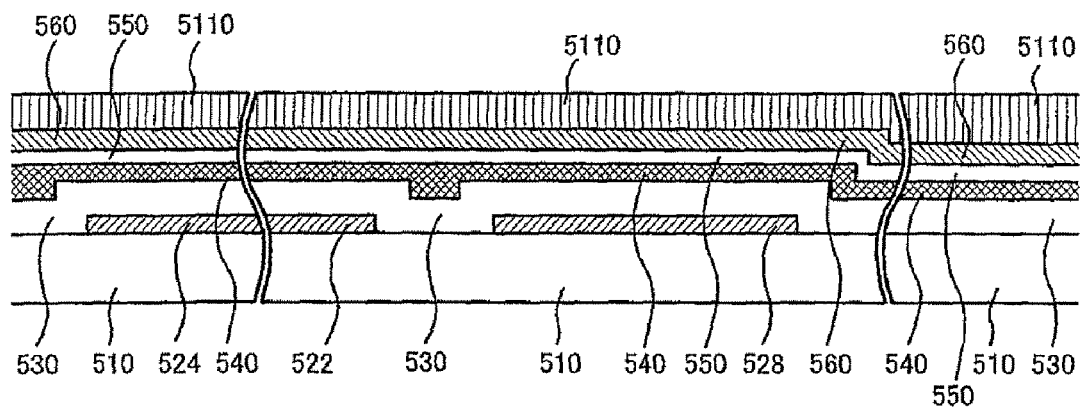
FIG. 22(a) is a cross-sectional view taken in the next stage of FIG. 21(b) along line IVb-IVb' of FIG. 21(a)
Figure 22B:
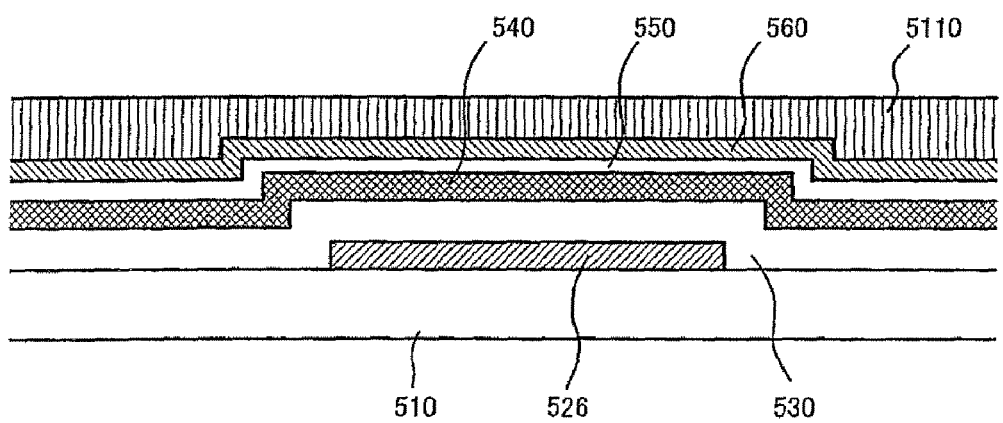
FIG. 22(b) is a cross-sectional view taken in the next stage of FIG. 21(c) along line IVc-IVc' of FIG. 21(a)

FIG. 22 includes cross-sectional views of the thin-film transistor plate in a second stage, where FIG. 22(a) is a cross-sectional view taken along line IVb-IVb' of FIG. 21(a), and FIG. 21(b) is a cross-sectional view taken along line IVc-IVc' of FIG. 21(a).

In the second stage, a vapor growth method is performed so that a gate insulating film 530, a semiconductor layer 540, and an intermediate layer (contact layer) 550 are continuously vapor deposited to thicknesses of 1500 Å to 5000 Å, 500 Å to 2000 Å, and 300 Å to 600 Å, respectively. Further, a conductor layer 560 of metal or the like is vapor deposited to a thickness of 1500 Å to 3000 Å through methods such as sputtering. Then, a photosensitive film 5110 (photosensitive resin (resist) layer) is applied thereon to a thickness of 1 µm to 2 µm.

FIG. 23 includes diagrams showing the structure of the thin-film transistor plate in a third stage, where FIG. 23(a) is a layout diagram, FIG. 23(b) is a cross-sectional view taken along line VIb-VIb' in the layout diagram of FIG. 23(a); and FIG. 21(c) is a cross-sectional view taken along line VIc-VIc' in the layout diagram of FIG. 23(a).

Figure 24A:
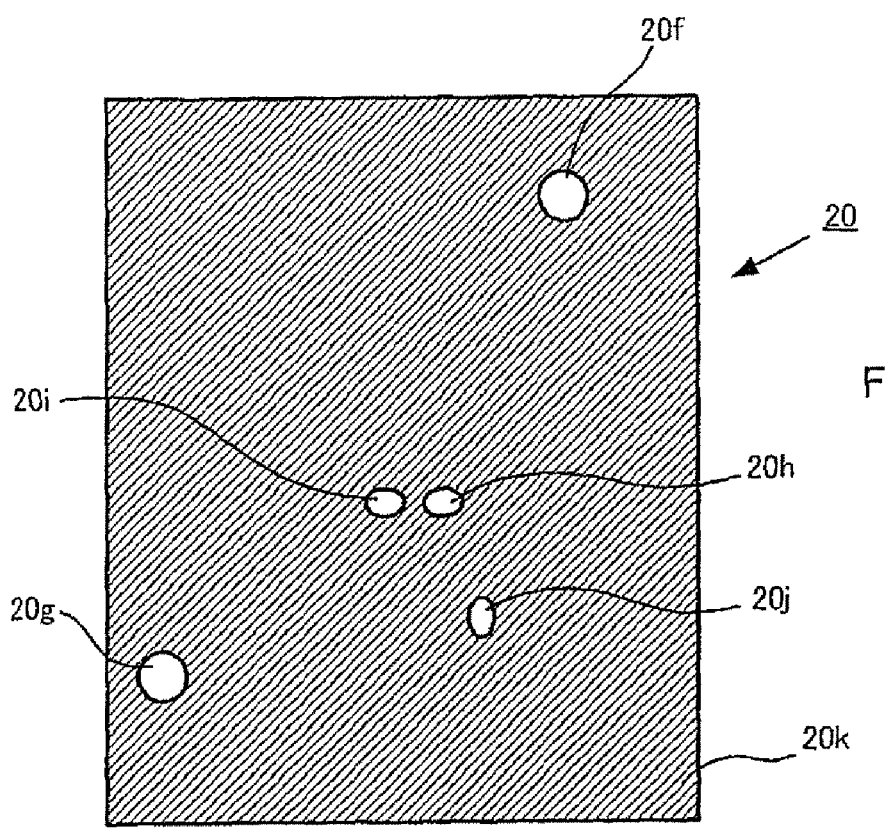
FIG. 24 is a layout diagram of a mask and a light converging pattern formation member used in the third stage in the method for manufacturing the flat panel display in the fifth embodiment.
Figure 24B:
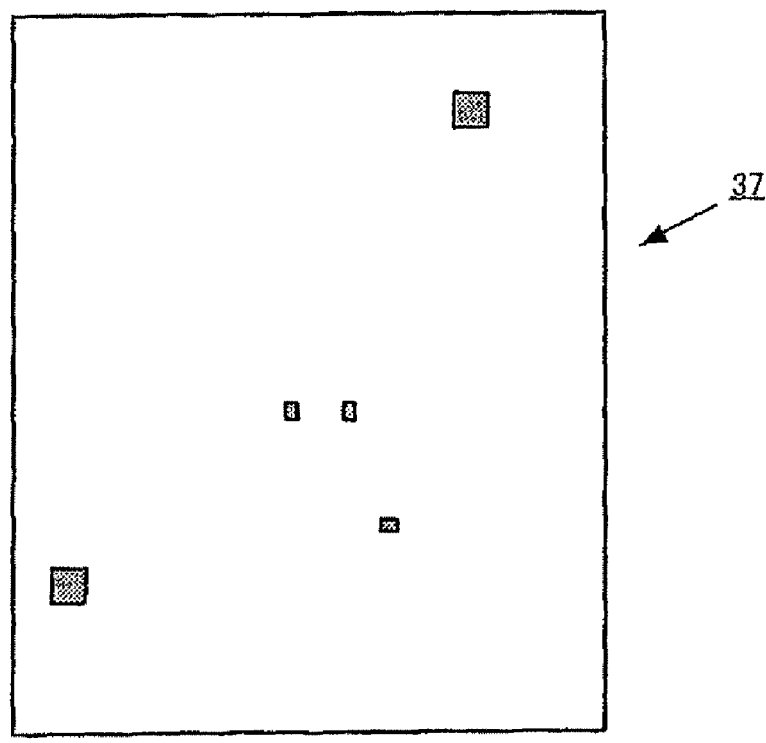

FIG. 24(a) is a layout diagram of the light converging pattern formation member 20 used in the third stage, and FIG. 24(b) is a layout diagram of the light pattern 37 formed by the light converging pattern formation member 20 used in the third stage.

As shown in FIG. 24(a), the light converging pattern formation member 20 used in the third stage includes a plurality of light converging portions 20f to 20j formed in a light transmissive plate, and a light shield portion (light reduction portion) 20k, which is a light shield or a light reduction pattern, formed in the region outside the light converging portions 20f to 20j. The light converging pattern formation member 20 is spaced apart by a predetermined gap from a plate 510, and the exposure light from the illumination portion is converged at the light converging portions 20f to 20j to form the light pattern (light converging pattern) 37 shown in FIG. 24(b) on the plate 510.

In the third stage, the light pattern exposure is performed on the photosensitive film 5110 using the exposure apparatus according to any one of the embodiments described above and the light converging pattern formation member 20.

At the third stage, a light pattern exposure is performed on the photosensitive film and than developed to form a first portion 5114 and a second portion 5112 of the photosensitive film pattern, as shown in FIGS. 23(b) and 23(c). In this case, a channel portion C (i.e., first portion 5114 located between a source electrode 565 and a drain electrode 566) of a thin-film transistor in the first portion 5114 and the second portion 5112 of the photosensitive film pattern is formed to be thinner than a data wiring portion A (i.e., second portion 5112 located at a portion where data wirings 562, 564, 565, 566, and 568 are formed), and the photosensitive film is completely removed from the remaining portion B.

Next, etching is performed on the first portion 5114 of the photosensitive film pattern and the underlying films, that is, the conductor layer 560, the contact layer 550, and the semiconductor layer 540. After the etching, the data wiring and the underlying films remain in the data wiring portion A. Further, only the semiconductor layer should remain in the channel portion C, and the gate insulating film 530 should appear after the three layers 560, 550, and 540 are completely removed in the remaining portion B.

Figure 25A:
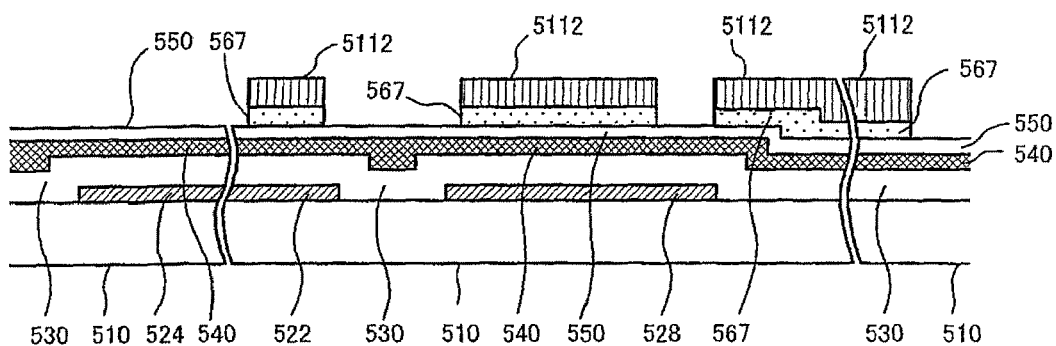
FIG. 25(a) is a cross-sectional view taken in the next stage of FIG. 23(b) along line VIb-VIb' of FIG. 23(a)
Figure 25B:
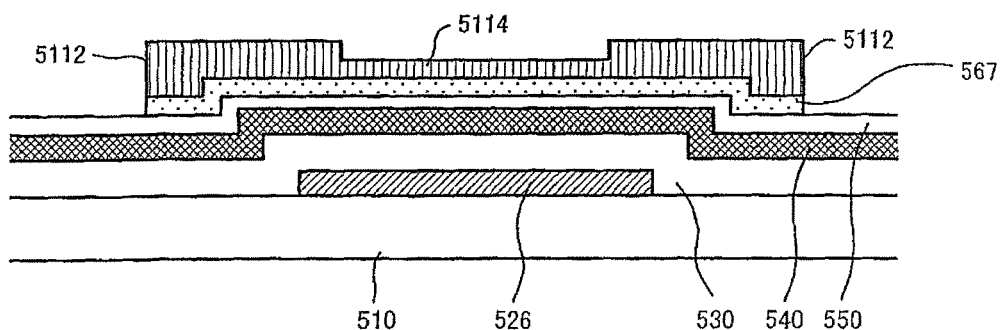
FIG. 25(b) is a cross-sectional view taken in the next stage of FIG. 23(c) along line VIc-VIc' of FIG. 23(a)

FIG. 25 is a cross-sectional view of the thin-film transistor plate in a fourth stage, where FIG. 25(a) is a cross-sectional view taken along line VIb-VIb' of FIG. 23(a), and FIG. 25(b) is a cross-sectional view taken along line VIc-VIc' of FIG. 23(a).

In the fourth stage, the conductor layer 560 exposed from the remaining portion B is removed to expose the underlying contact layer 550, as shown in FIG. 25(a) and FIG. 25(b). In this process, both dry type and wet type methods can be used.

Figure 26A:
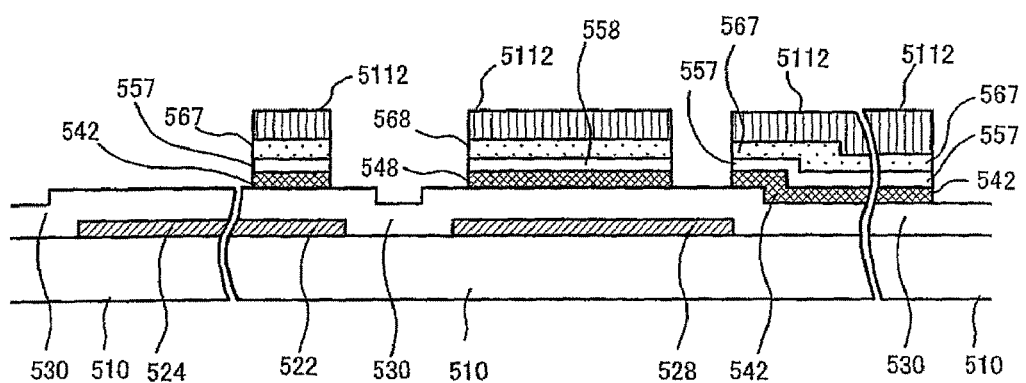
FIG. 26(a) is a cross-sectional view taken the next stage of FIG. 25(a) along line VIb-VIb' of FIG. 23(a)
Figure 26B:
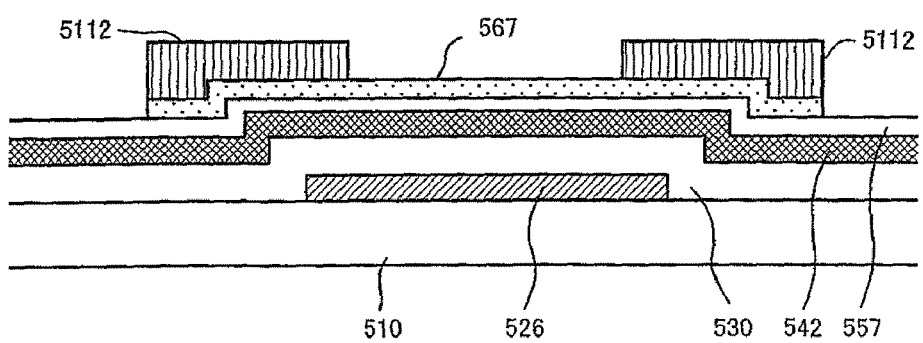
FIG. 26(b) is a cross-sectional view taken in the next stage of FIG. 25(b) along line VIc-VIc' of FIG. 23(a)

FIG. 26 includes cross-sectional views of the thin-film transistor plate in a fifth stage, where FIG. 26(a) is a cross-sectional view taken along line VIb-VIb' of FIG. 23(a), and FIG. 26(b) is a cross-sectional view taken along line VIc-VIc' of FIG. 23(a).

In the fifth stage, the contact layer 550 exposed from the remaining portion B and the underlying semiconductor layer 540 are simultaneously removed through dry etching method together with the first portion 5114 of the photosensitive film, as shown in FIGS. 26(a) and 26(b). The etching removes the first portion 5114 and the second portion 5112 of the photosensitive pattern, and the photosensitive film remainders on the surfaces of the contact layer 550 and the conductor pattern 567.

Figure 27A:
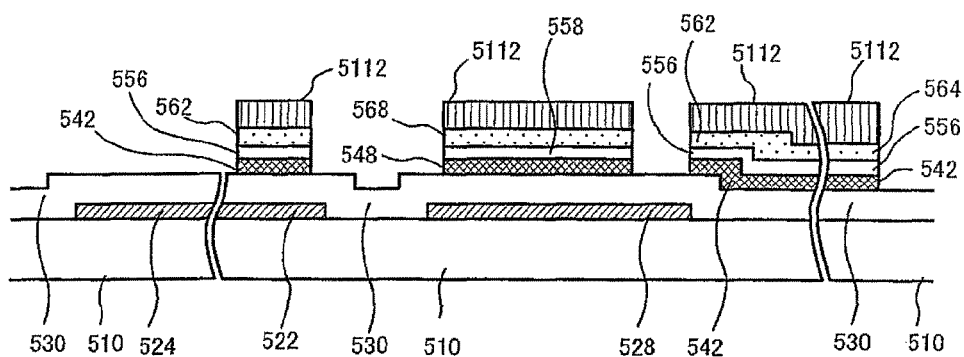
FIG. 27(a) is a cross-sectional view taken in the next stage of FIG. 26(a) along line VIb-VIb' of FIG. 23(a)
Figure 27B:
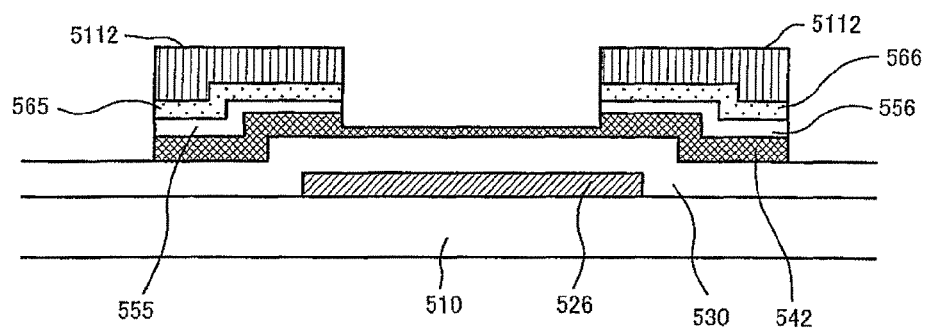
FIG. 27(b) is a cross-sectional view taken in the next stage of FIG. 26(b) along line VIc-VIc' of FIG. 23(a)
Figure 29:
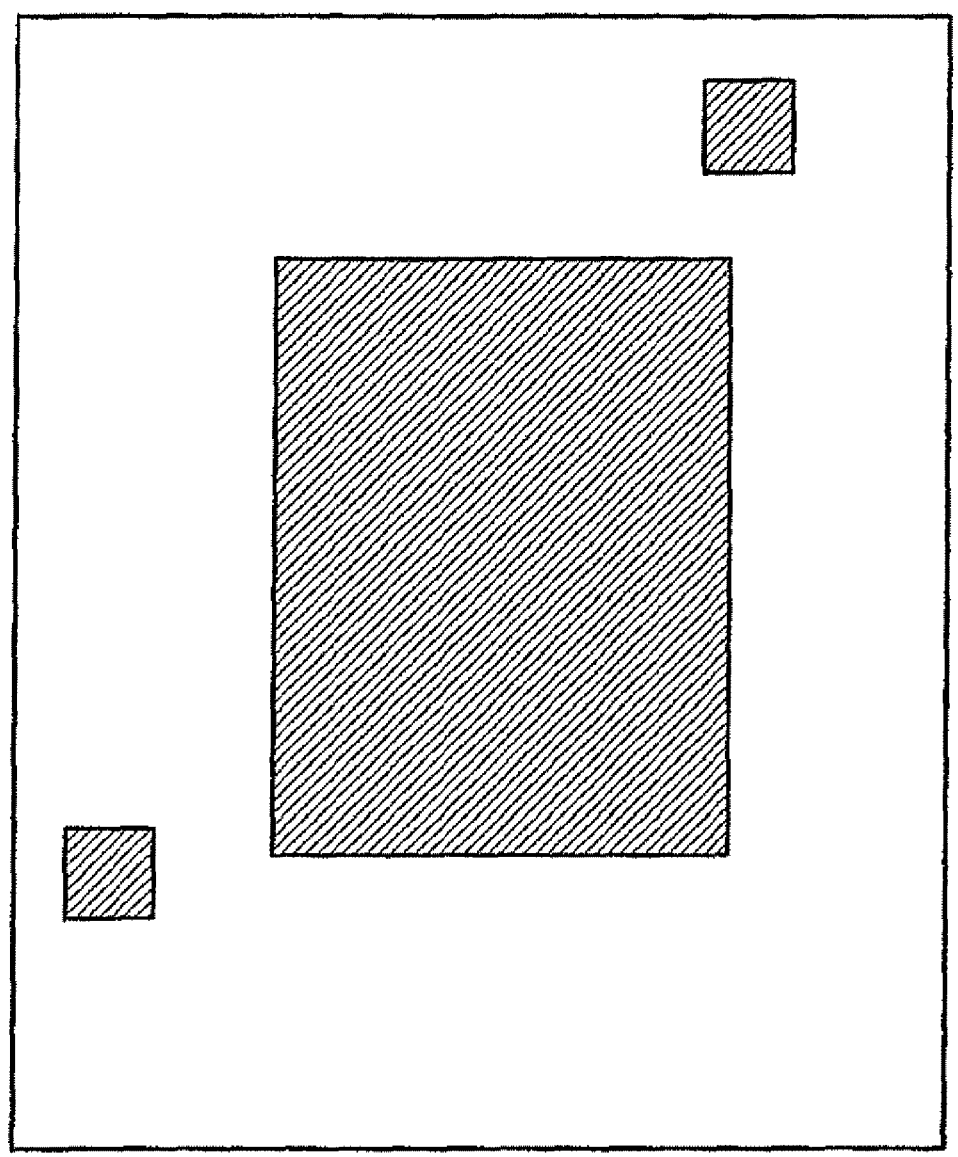
FIG. 29 is a layout diagram of a mask used at a ninth stage of the method for manufacturing the flat panel display in the fifth embodiment.

FIG. 27 is a cross-sectional view of the thin-film transistor plate in a sixth stage, where FIG. 27(a) is a cross-sectional view taken along line VIb-VIb' of FIG. 23(a), and FIG. 27(b) is a cross-sectional view taken along line VIc-VIc' of FIG. 23(a).

In the sixth stage, the source/drain conductor pattern 567 of the channel portion C and an underlying source/drain contact layer pattern 557 are etched and removed, as shown in FIGS. 27(a) and 27(b). This removes the first portion 5114 of the photosensitive film pattern located in the channel portion C and exposes the source/drain conductor pattern 567. Further, the contact layer 550 and the semiconductor layer 540 located in the remaining portion B are removed to expose the underlying gate insulating film 530.

The second portion 5112 of the photosensitive pattern corresponding to the data wiring portion A is also etched. Thus, the second portion 5112 becomes thin. The semiconductor patterns 542 and 548 are completed in this stage. Reference numerals 557 and 558 in the drawings indicate the contact layer patterns below the source/drain conductor pattern 567 and the sustain capacitor conductor pattern 568, respectively.

This separates the source electrode 565 and the drain electrode 566 and completes the data wirings (562, 564, 565, 566, and 568) and the underlying contact layer patterns 555, 556, and 558.

Finally, the second portion 5112 of the photosensitive film pattern remaining in the data wiring portion A is removed. The second portion 5112 may be removed after removing the source/drain conductor pattern 567 located in the channel portion C and before removing the underlying contact layer pattern 557.

FIG. 28 includes diagrams showing the structure of the thin-film transistor plate in a seventh stage, where FIG. 28(a) is a layout diagram, FIG. 28(b) is a cross-sectional view taken along line XIIb-XIIb' in the layout diagram of FIG. 28(a), and FIG. 28(c) is a cross-sectional view taken along line XIIc-XIIc' in the layout diagram of FIG. 28(a).

In a seventh stage, after forming the data wirings (562, 564, 565, 566, and 568) in the above manner, a protective film 570 having a thickness of 3000 Å or greater is formed by vapor depositing silicon nitride through CVD method or spin coating organic insulation substance, as shown in FIGS. 28(a) to 28(c). The photosensitive film is then applied to the protective film 570.

In an eighth stage, light pattern exposure is performed on the photosensitive film using the mask 10 and light converging pattern formation member 20 shown in FIG. 3 and the exposure apparatus of one of the embodiments and modifications.

The photosensitive film that has undergone light pattern exposure is developed and used as a mask to etch the protective film 570 and the gate insulating film 530 and form contact holes 571, 572, 573, and 574 for exposing the drain electrode 566, the gate pad 524, the data pad 564, and the sustain capacitor conductor pattern 568.

Figure 30A:
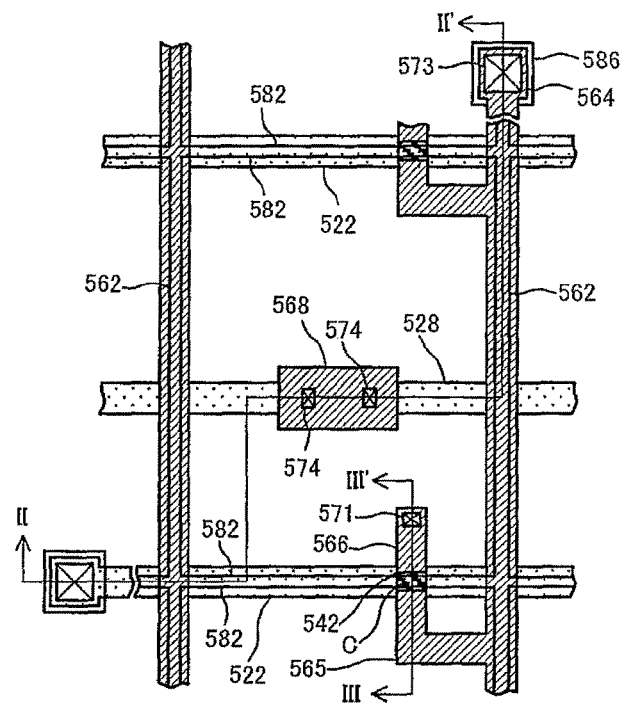
FIG. 30(a) is a layout diagram.
Figure 30B:
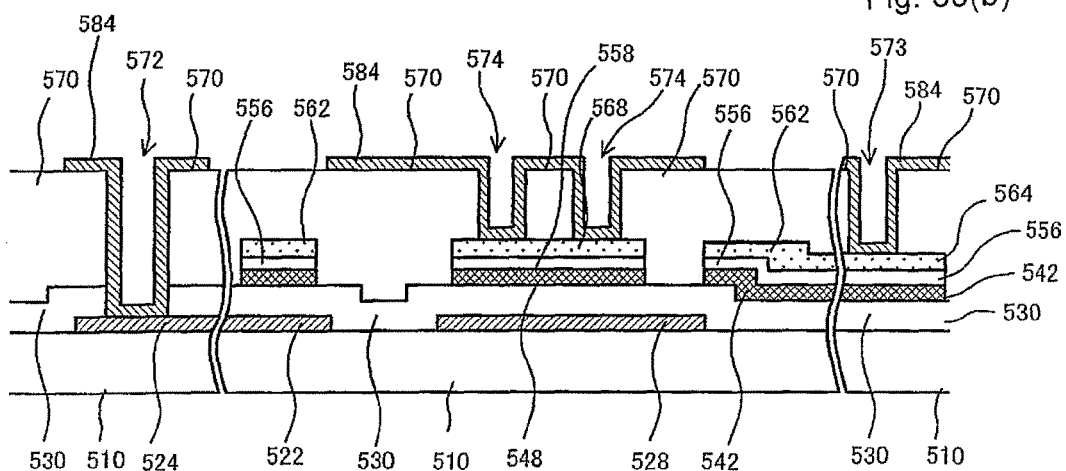
FIG. 30(b) is a cross-sectional view of a thin-film transistor plate shown in FIG. 30(a) taken along line II-II' and III-III'.
Figure 30C:
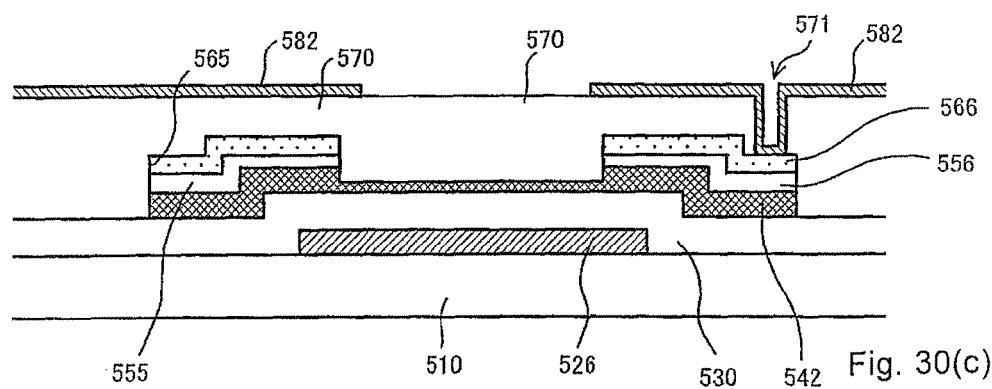
FIG. 30(c) is a cross-sectional view of the thin-film transistor plate shown in FIG. 30(a) taken along line III-III'.

Subsequently, in a ninth stage, an ITO layer having a thickness of 400 Å to 500 Å is vapor deposited, and a photosensitive film is applied to the ITO layer. A light pattern exposure is performed on the photosensitive film using the mask shown in FIG. 29, and the photosensitive film is developed. Etching is performed using the developed photosensitive film as a mask to form a pixel electrode 582, an auxiliary gate pad 584, and an auxiliary data pad 586. The thin-film transistor plate for a flat panel display of the fifth embodiment is manufactured through the above process. That is, step S401 is completed. FIG. 30 includes diagrams showing the structure of the thin-film transistor, where FIG. 30(a) is a layout diagram, FIG. 30(b) is a cross-sectional view of the thin-film transistor plate shown in FIG. 30(a) and taken along line II-II' and line III-III', and FIG. 30(c) is a cross-sectional view showing the thin-film transistor plate shown in FIG. 30(a) taken along line III-III'.

Returning to FIG. 20, in the next step S402 (color filter formation process), many sets of three fine filters corresponding to red R, green G, and blue B are arranged in a matrix or sets of a plurality of strip-like filters of the three colors of red R, green G, and blue B are arranged in a horizontal scanning line direction to form a color filter. In the following step S403 (cell assembly process), liquid crystals are injected between the plate having a predetermined pattern obtained in step S401 and a color filter obtained in step S402 to manufacture a liquid crystal panel (liquid crystal cell).

In the following step S404 (module assembly process), parts such as an electrical circuit, which performs a display operation with the liquid crystal panel (liquid crystal cell) assembled as described above, and a backlight are attached to complete a liquid crystal display device.

As described above, in the fifth embodiment, a flat panel display can be manufactured while suppressing costs. In particular, when using the exposure apparatus of the first to the third embodiments and their modifications, the cost of a flat panel display may be reduced by using the exposure apparatus that is available at a low cost. When using the exposure apparatus of the fourth embodiment and its modifications, the lithography process is performed with a high throughput. Thus, the manufacturing cost of the flat panel display can be suppressed.

In the fifth embodiment, fine features may be formed using the exposure apparatus of the first to the fourth embodiments and their modifications, and other circuit patterns may be formed using printing methods such as inkjet printing, screen printing (porous printing), offset printing (planographic printing), intaglio printing, relief printing, or the like. In addition to a light transmissive flat plate such as glass, a thin flexibility sheet of a light transmissive resin may be used as the plate.

Figure 31:
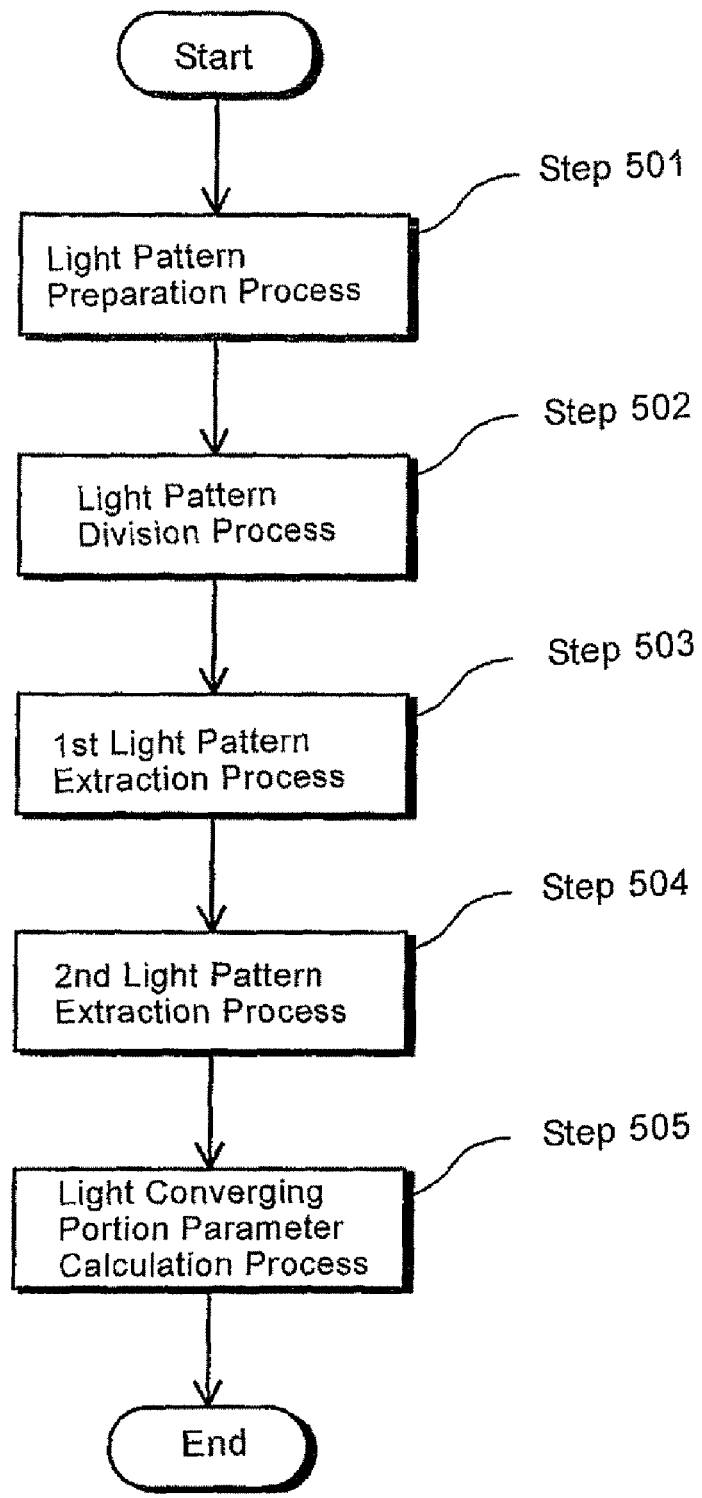
FIG. 31 is a flowchart illustrating a method for designing a mask and a light converging pattern formation member according to a sixth embodiment of the present invention.

A sixth embodiment, which is a method for designing a mask and a light converging pattern formation member, will be described with reference to FIG. 31.

In step S501 (light pattern preparation process) illustrated in FIG. 31, light pattern data (hereinafter referred to as first light pattern data) of a light pattern having the same shape as the light pattern ultimately formed on the photoresist is generated.

In step S502 (light pattern division process), the first pattern data generated in step S501 is divided into plural sets of light patterns. In the present embodiment, the first light pattern data is broken down to, for example, line pattern components, island pattern components, and hold pattern components.

In step S503 (first light pattern extraction process), a light pattern having large pattern dimensions is extracted as third light pattern data from the light pattern data broken down in step S502 (hereinafter referred to as second pattern data). In the present embodiment, a component having pattern dimensions that can be resolved with a proximity exposure method is extracted as third light pattern data. The third light pattern data corresponds to design data of the mask 10.

In step S504 (second light pattern extraction process), the difference between the second light pattern data and the third light pattern data is extracted as fourth light pattern data. In the present embodiment, the fourth light pattern data is for the light pattern that is to be formed with the plurality of light converging portions of the light converging pattern formation member.

In step S505 (light converging portion parameter calculation process), the parameters of the plurality of light converging portions for forming the fourth light pattern data are obtained. In the present embodiment, the parameters include XY coordinates (position in the light converging pattern formation member) of each light converging portion, distance along the Z direction from the plate P, focal length and numerical aperture in the XZ cross-section, focal length and numerical aperture in the YZ cross-section, and light reduction rate at the light converging portion.

The parameters for the plurality of light converging portions 20a and 20b shown in FIG. 3 that form the light pattern 36 (correspond to fourth light pattern data) shown in FIG. 2 will be discussed. First, the XY coordinates of the plurality of light converging portions 20a and 20b is obtained from the barycentric position of two bright portions in the light pattern 36.

Then, the numerical aperture of the XZ cross-section and the numerical aperture of the YZ cross-section of the plurality of light converging portions 20a and 20b are obtained with two bright portions having X direction dimensions of 10 μm and Y direction dimensions of 3 μm. In this state, if the collimation half angle of the exposure light irradiating the light converging pattern formation member 20 is 0°, the numerical aperture of the XZ cross-section of the plurality of light converging portions 20a and 20b becomes substantially zero, and the numerical aperture of the YZ cross-section of the plurality of light converging portions 20a and 20b becomes 0.082.

With the gap (proximity gap) in the Z direction between the light converging pattern formation member 20 and the plate P being 100 μm, the focal length and dimensions of the XZ cross-section and the focal length and dimensions of the YZ cross-section of the plurality of light converging portions 20a and 20b are obtained. Here, the focal length of the XZ cross-section is infinite and its dimension (dimension in the X direction of the plurality of light converging portions 20a and 20b) is 10 μm. The focal length of the YZ cross-section is 100 μm and its dimension (dimension in the Y direction of the plurality of light converging portions 20a and 20b) is 300 μm. In other words, the plurality of light converging portions 20a and 20b are cylindrical lenses having an operating distance of 100 μm and having a power (focal length of 300 μm) in one direction (Y direction).

The collimation half angle of the exposure light irradiated onto the light converging pattern formation member 20 may be 0° to 5°, and the proximity gap may be 1 μm to 1000 μm.

From the obtained parameters of the plurality of light converging portions 20a and 20b, a curvature (curvature radius) of the lens surface is obtained if the plurality of light converging portions 20a and 20b are lens surfaces. The shape and layout of the diffraction pattern is obtained if the plurality of light converging portions 20a and 20b are phase (amplitude) diffraction patterns.

In the light pattern 36 shown in FIG. 2, the light intensity is weaker than the light pattern 34 to perform halftone exposure. Here, the light reduction rate at the plurality of light converging portions 20a and 20b is also obtained.

In step S505, light shield pattern data (hereinafter referred to as fifth light shield pattern data) for forming light shield regions outside the plurality of light converging portions 20a and 20b are also generated.

The design data of the light converging pattern formation member and the design data of the mask can be obtained through steps S501 to S505.

A method for manufacturing the light converging pattern formation member from the design data of the light converging pattern formation member obtained in the sixth embodiment will now be described as a seventh embodiment with reference to FIG. 32.

Figure 32:
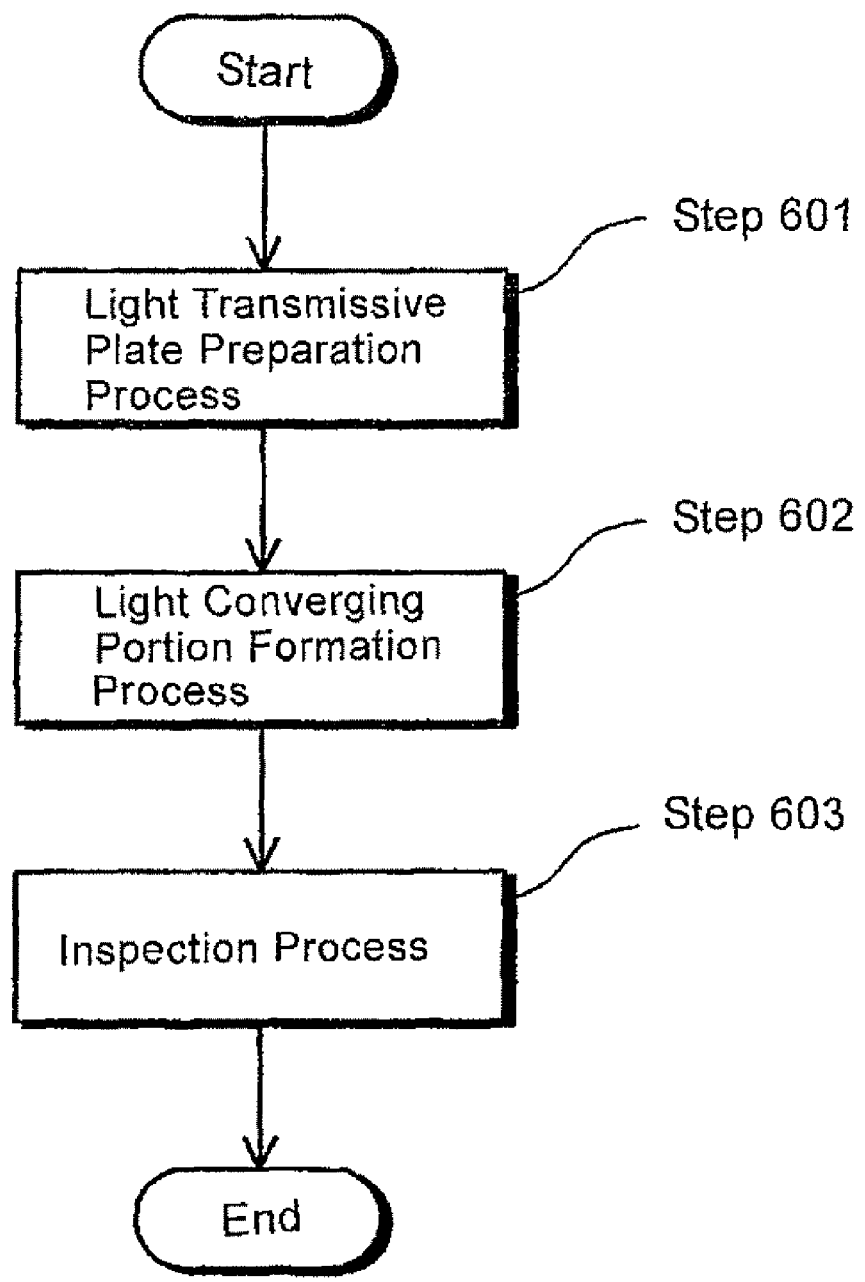
FIG. 32 is a flowchart describing a method for manufacturing a light converging pattern formation member according to a seventh embodiment of the present invention.

In step S601 (light transmissive plate preparation process) of FIG. 32, a light transmissive plate is formed. A plate material such as silica glass is grinded and polished into plate shaped to have parallel planes. Then, a light shield film of chromium or the like is formed on the surface through vapor deposition or sputtering. Generally, a photosensitive resin (resist) is applied to the light transmissive plate in step S601.

In step S602 (light converging portion formation process), a pattern is drawn on the plate to which the photosensitive resin is applied based on the design data obtained in the sixth embodiment. Then, processing such as development, post-bake, descum, etching, and resist removal are performed to form a plurality of light converging portions on the light transmissive plate. The light shield portion formed in step S601 remains in the region outside the plurality of light converging portions. If the plurality of light converging portions are lens surfaces, pattern drawing is simply performed using a grayscale mask having a transmittance distribution (grayscale) in the main plane direction in step S602.

In step S603 (inspection process), the plurality of light converging portions formed in step S602 are inspected. If the plurality of light converging portions are amplitude (phase) diffraction patterns, comparative inspection is conducted from the viewpoints of pattern dimension accuracy, pattern position accuracy, and outer appearance quality based on the design data of the light converging pattern formation member obtained in the sixth embodiment. If the plurality of light converging portions are lens surfaces, the shape (distribution) of the light pattern formed by the plurality of light converging portions is measured by performing test exposure on the inspection photosensitive plate using the plurality of light converging portions or using a photodetector that is movable in a two-dimensional manner. The measured shape (distribution) of the light pattern and the design pattern are compared and inspected.

The light converging pattern formation member is manufactured through steps S601 to S603.

When manufacturing the mask from the design data of the mask obtained in the sixth embodiment, a light transmissive plate that becomes a mask plate is prepared, and a pattern is drawn on the light transmissive plate to which photosensitive resin is applied based on the mask design data in the same manner as in step S601. Processing such as development, post-bake, descum, etching, and resist removal are performed on the light transmissive plate. The mask after the processing is finally compared and inspected with the design data. The mask is manufactured from the design data of the mask obtained in the sixth embodiment through such procedures.

The above embodiments are described to facilitate the understanding of the present invention and are not described to limit the present invention. Therefore, each element disclosed in the embodiment encompasses all design changes and equivalents that fall within the technical scope of the present invention. Further, components of the above embodiments may be combined.

In the exposure apparatus of to each embodiment described above, a laser interferometer is used to perform stage position measurement. However, other measurement sensors such as an encoder may be used in lieu of or in combination with the laser interferometer.

The light source used in the exposure apparatus of each embodiment described above is illustrative, and KrF excimer laser (wavelength 248 nm), ArF excimer laser (wavelength 193 nm), $F_2$ laser (wavelength 157 nm), or other light sources may be used. Furthermore, a laser plasma light source or a soft X-ray region generated from the SOR (synchrotron orbital radiation) such as EUV (extreme ultraviolet) having a wavelength of 13.4 nm or 11.5 nm may be used. An electron beam or charged particle beam such as ion beam may be used. A semiconductor laser or LED that radiates light of ultraviolet region, or a harmonic wave in which laser of infrared region or visible region is wavelength converted to ultraviolet light using non-linear optical crystal may be used.

When forming a light converging pattern having a shape that extends in a predetermined single direction on the plate P with the light converging pattern formation member, exposure light of which main component is a polarization component having s polarization with respect to the plate P and having a polarizing direction parallel to the single direction may be supplied from the illumination portion. Polarizers respectively corresponding to the plurality of light converging portions may be arranged on the light converging pattern formation member, and the plurality of light converging portions may be used for light converging portions having different shapes.

In order to reduce adverse effects of exposure light reflection at a plate surface or at a photosensitive material applied to the plate surface, exposure light of which main component is a polarization component having p polarization with respect to the plate P may be supplied from the illumination portion.

The applicable range of the exposure apparatus in each of the above-described embodiments is not limited to use for manufacturing a semiconductor device, an imaging element, a thin-film magnetic head, and a flat panel display and also includes the manufacturing of a micro-machine, a DNA chip, a mask, or a reticle.

In the exposure apparatus of each of the embodiments described above, exposure or a so-called liquid immersion exposure may be performed in which at least one of a gap between the mask and the plate and a gap between the light converging pattern formation member and the plate is filled with liquid. In this case, a nozzle mechanism (liquid supply nozzle and liquid collection nozzle) disclosed in International Patent Publication No. WO99/49504 is used to locally fill the gap with liquid. International Patent Publication No. WO99/49504 is incorporated by reference herein.

The magnification of the projection optical system used in the exposure apparatus of the fourth embodiment and its modifications may be any one of equal magnification, reduction magnification, and enlargement magnification. Further, any one of a reflection optical system, a refraction optical system, and a reflection-refraction optical system may be used.

When using a planar motor as a drive device for the stage, either one of a magnet unit and an armature unit is connected to a stage, and the other one of the magnet unit and the armature unit is arranged on the movable surface side (base) of the stage.

The reactive force generated by the movement of the stage may be mechanically released to the floor (ground) using a frame member, as described in U.S. Pat. No. 5,528,118. Instead or in addition to the frame member, a counter mass method of canceling the reactive force generated by the movement of the stage using the law of conservation of momentum may be used as described in U.S. Pat. Nos. 6,969,966. 5,528,118 and 6,969,966 are incorporated by reference herein.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An exposure method comprising:
   a first exposure step of irradiating a mask, which is arranged near a plate, with exposure light and exposing a predetermined pattern formed on the mask onto the plate; and
   a second exposure step of irradiating a light converging pattern formation member including a plurality of light converging portions that are arranged near the plate and are located at predetermined distances from the mask in a direction parallel to a surface of the plate, with exposure light and exposing a light converging pattern including a predetermined shape onto the plate;
   wherein at least part of the predetermined pattern exposed onto the plate in the first exposure step and at least part of the light converging pattern formed on the plate in the second exposure step overlap each other.

2. The exposure method according to claim 1, wherein the first exposure step includes performing exposure in a state in which the mask and the plate are relatively still.

3. The exposure method according to claim 1, wherein the second exposure step includes performing exposure in a state in which the light converging pattern and the plate are relatively still.

4. The exposure method according to claim 1, wherein the second exposure step includes performing exposure while relatively moving the plate and a position at which the light converging pattern is formed.

5. The exposure method according to claim 1, wherein the first exposure step includes performing exposure while relatively moving the mask and the plate.

6. The exposure method according to claim 1, further comprising:
   a first movement step of relatively moving the mask and the plate along a first direction.

7. The exposure method according to claim 6, further comprising:
   a layout step of laying out the mask and the light converging pattern formation member along the first direction.

8. The exposure method according to claim 6, further comprising:
   a second movement step of relatively moving the mask and the plate along a second direction, which is a direction that transverses the first direction.

9. The exposure method according to claim 6, wherein the mask is one of a plurality of masks, the method further comprising:
   a layout step of arranging the plurality of masks in a staggering manner in a plane substantially parallel to the plate.

10. The exposure method according to claim 1, wherein the light converging pattern formed in the second exposure step includes features that are finer than those of the predetermined pattern exposed in the first exposure step.

11. An exposure method comprising:
    a first exposure step of exposing a predetermined first pattern onto a first region of a plate in a state in which the plate is still relative to the first pattern;
    a second exposure step of exposing a predetermined second pattern corresponding to a plurality of light converging portions onto the first region of the plate while relatively moving the plurality of light converging portions and the plate; and
    a movement step of relatively moving the plate and a position at which the first pattern is formed to expose the first pattern onto a second region of the plate that differs from the first region;
    wherein the second exposure step is performed when the movement step is performed, and wherein the plurality of light converging portions are arranged at predetermined distances from the first pattern in a direction parallel to a surface of the plate.

12. The exposure method according to claim 11, wherein the first exposure step includes performing a first exposure using a mask, which is arranged near the plate and includes a pattern corresponding to the first pattern.

13. The exposure method according to claim 12, wherein the second exposure step includes irradiating a light converging pattern formation member, which is arranged near the plate and includes the plurality of light converging portions that are arranged at the predetermined distances from the first pattern in the direction parallel to the surface of the plate, with exposure light and exposing a light converging pattern including a predetermined shape onto the plate.

14. The exposure method according to claim 13, wherein the second exposure step includes a step of selectively irradiating the plurality of light converging portions with light.

15. An exposure apparatus comprising:
    a first holding portion which holds a mask including a predetermined pattern near a plate;
    a second holding portion which holds a light converging pattern formation member that includes a plurality of light converging portions that form light patterns including predetermined shapes on the plate, such that the plurality of light converging portions are arranged near the plate and are located at predetermined distances from the mask in a direction parallel to a surface of the plate; and
    an illumination portion which irradiates the mask and the light converging pattern formation member with exposure light.

16. The exposure apparatus according to claim 15, further comprising:
    a plate stage which supports the plate to be movable in a first direction.

17. The exposure apparatus according to claim 16, wherein the first holding portion and the second holding portion hold the mask and the light converging pattern formation member along the first direction.

18. The exposure apparatus according to claim 16, wherein the plate stage is movable along a second direction, which is a direction that transverses the first direction.

19. The exposure apparatus according to claim 16, wherein the first holding portion is one of a plurality of first holding portions, the mask is one of a plurality of masks, and the plurality of first holding portions hold the plurality of masks in a staggering manner in a plane that is substantially parallel to the plate.

20. The exposure apparatus according to claim 16, further comprising:
    a control unit which controls the illumination portion and the plate stage, wherein the control unit irradiates the mask with the exposure light in a state in which the mask and the plate are relatively still.

21. The exposure apparatus according to claim 16, further comprising:
    a control unit for controlling the illumination portion and the plate stage, wherein the control unit irradiates the light converging pattern formation member with the exposure light in a state in which the light converging pattern and the plate are relatively still.

22. The exposure apparatus according to claim 16, further comprising:
a control unit for controlling the illumination portion and the plate stage, wherein the control unit irradiates the light converging formation pattern with the exposure light while relatively moving the plate and a position at which the light converging pattern is formed along the first direction.

23. The exposure apparatus according to claim 16, further comprising:
a control unit for controlling the illumination portion and the plate stage, wherein the control unit irradiates the mask with the exposure light while relatively moving the mask and the plate along the first direction.

24. The exposure apparatus according to claim 16, wherein the plurality of light converging portions are positioned on the light converging pattern formation member so that at least some of the light patterns formed by the plurality of light converging portions overlaps a position at which the pattern of the mask is to be transferred.

25. The exposure apparatus according to claim 15, wherein the plurality of light converging portions include a light converging light shield pattern arranged on the light converging pattern formation member.

26. The exposure apparatus according to claim 25, wherein:
the mask and the light converging pattern formation member are formed integrally;
the predetermined pattern of the mask includes a light shield pattern; and
the first holding portion and the second holding portion are arranged integrally.

27. The exposure apparatus according to claim 25, wherein the mask and the light converging pattern formation member are separate members.

28. The exposure apparatus according to claim 15, wherein the light converging pattern formation member includes a light transmissive plate and a phase diffraction pattern formed on the light transmissive plate.

29. The exposure apparatus according to claim 15, wherein the light converging pattern formation member includes a light transmissive plate and a lens surface formed on the light transmissive plate.

30. The exposure apparatus according to claim 15, wherein the plurality of light converging portions of the light converging pattern formation member includes a power in the first direction, and the light converging portions includes a power in a second direction that transverses the first direction, with the power in the first direction differing from the power in the second direction.

31. The exposure apparatus according to claim 16, wherein the plurality of light converging portions are arranged in a two-dimensional manner on the light converging pattern formation member.

32. The exposure apparatus according to claim 31, wherein the illumination portion includes a spatial light modulator arranged in an optical path of the exposure light directed towards the light converging pattern formation member, with the spatial light modulator selectively irradiating the plurality of light converging portions with light.

33. The exposure apparatus according to claim 15, wherein the illumination portion includes a telecentricity control unit that controls telecentricity of the exposure light.

34. The exposure apparatus according to claim 33, wherein:
the illumination portion includes a first illumination portion that irradiates the mask with the exposure light and a second illumination portion that irradiates the light converging pattern formation member with the exposure light; and
the telecentricity control unit includes a first telecentricity control unit, which is arranged in the first illumination portion and controls the telecentricity of the exposure light directed towards the mask, and a second telecentricity control unit, which is arranged in the second illumination portion and controls the telecentricity of the exposure light directed towards the light converging pattern formation member.

35. The exposure apparatus according to claim 33, further comprising:
a plate deformed state detection unit for detecting a deformed state of the plate, wherein the telecentricity control unit controls the telecentricity of the exposure light based on an output from the plate deformed state detection unit.

36. The exposure apparatus according to claim 35, wherein the plate deformed state detection unit detects an alignment mark arranged on the plate.

37. The exposure apparatus according to claim 35, further comprising:
a telecentricity measurement unit for measuring the telecentricity of the exposure light, wherein the telecentricity control unit controls the telecentricity of the exposure light based on an output from the plate deformed state detection unit and an output of the telecentricity measurement unit.

38. The exposure apparatus according to claim 15, wherein the second holding portion holds the light converging pattern formation member so that a gap between the light converging pattern formation member and the plate is adjustable.

39. The exposure apparatus according to claim 38, further comprising:
a plane position detection unit for detecting a plane position along a direction of the gap of the plate, wherein the gap is controlled in accordance with an output from the plane position detection unit.

40. An exposure apparatus comprising:
a first exposure portion which exposes a predetermined first pattern onto a first region of a plate;
a second exposure portion which exposes a predetermined second pattern onto the first region of the plate;
a plate moving portion which moves the plate along a predetermined first direction; and
a control unit which controls exposure with the first and second exposure portions and movement of the plate with the plate moving portion, wherein the control unit holds the first pattern and the plate in a relatively still state when the first exposure portion performs exposure, and the control unit performs exposure with the second exposure portion when relatively moving the plate and a position at which the first pattern is formed to expose the first pattern onto a second region that differs from the first region of the plate,
wherein the second exposure portion includes a second holding portion that holds a light converging pattern formation member including a plurality of light converging portions that form a light pattern shaped in correspondence with the second pattern on the plate and are arranged near the plate and are located at predetermined distances from the first pattern in a direction parallel to a surface of the plate.

41. The exposure apparatus according to claim 40, wherein the first exposure portion includes:
   a first holding portion that holds a mask, on which the first pattern is formed, near the plate; and
   a first illumination portion that irradiates an exposure light onto the mask.

42. The exposure apparatus according to claim 40, wherein the second exposure portion includes:
   a second illumination portion that irradiates the light converging pattern formation member with exposure light.

43. The exposure apparatus according to claim 42, wherein the second exposure portion includes a spatial light modulator for selectively irradiating the plurality of light converging portions with light.

44. A device manufacturing method comprising:
   an exposure step using the exposure method according to claim 1 to expose the predetermined pattern and the light converging pattern onto a photosensitive plate;
   a development step of developing the photosensitive plate on which the pattern has been transferred and forming on a surface of the photosensitive plate a mask layer including a shape corresponding to the pattern; and
   a processing step of processing the surface of the photosensitive plate by means of the mask layer.

45. A device manufacturing method comprising:
   an exposure step using the exposure apparatus according to claim 15 to expose the pattern onto a photosensitive plate;
   a development step of developing the photosensitive plate on which the pattern has been transferred and forming on a surface of the photosensitive plate a mask layer including a shape corresponding to the pattern; and
   a processing step of processing the surface of the photosensitive plate by means of the mask layer.

46. An exposure method for irradiating a plate with exposure light and forming a pattern on the plate, the method comprising:
   a first arrangement step of arranging a first region of the plate and a first surface of a first member so as to be spaced apart from each other by a first gap;
   a first exposure step of irradiating, via the first surface, the first region that is arranged in the first arrangement step with exposure light and exposing a first part of the pattern onto the first region;
   a second arrangement step of arranging the first region onto which the first part of the pattern has been exposed and a second surface of a second member so as to be spaced apart from each other by a second gap; and
   a second exposure step of irradiating, via the second surface, the first region that is arranged in the second arrangement step with the exposure light and exposing a second part of the pattern onto the first region,
   wherein the first arrangement step includes arranging the first surface in which one of a mask pattern and a plurality of light converging portions that form a light converging pattern has been provided; and
   wherein the second arrangement step includes arranging the second surface in which the other one of the mask pattern and the plurality of light converging portions has been provided, at a location separated from the one of the mask pattern and the plurality of light converging portions in a direction parallel to a surface of the plate.

47. The exposure method according to claim 46, wherein the second arrangement step includes step moving the plate including the first region onto which the first part of the pattern has been exposed in the direction parallel to the surface of the plate to arrange the first region below the second surface.

48. The exposure method according to claim 46, wherein the second part of the pattern includes a dimension smaller than that of the first part of the pattern.

49. The exposure method according to claim 46, wherein the first gap and the second gap each are set within a value of 1 μm to 1000 μm.

50. An exposure apparatus for irradiating a plate with exposure light and forming a pattern on the plate, the exposure apparatus comprising:
   a plate holder that movably holds the plate;
   a first holding portion that holds a first member such that a first surface of the first member and a first region of the plate held by the plate holder are spaced apart from each other by a first gap;
   a first exposure portion which exposes, via the first surface, the first region spaced apart from the first surface by the first gap with the exposure light and exposing a first part of the pattern onto the first region;
   a second holding portion that holds a second member such that the first region onto which the first part of the pattern has been exposed and which is held by the plate holder and a second surface of the second member are spaced apart from each other by a second gap; and
   a second exposure portion that irradiates, via the second surface, the first region spaced apart from the second surface by the second gap with the exposure light and exposing a second part of the pattern onto the first region,
   wherein the first holding portion holds the first member including the first surface in which one of a mask pattern and a plurality of light converging portions that form a light converging pattern has been provided; and
   wherein the second holding portion holds the second member including the second surface in which the other one of the mask pattern and the plurality of light converging portions has been provided, at a location separated from the one of the mask pattern and the plurality of light converging portions in a direction parallel to a surface of the plate held by the plate holder.

51. The exposure apparatus according to claim 50, wherein the plate holder step moves the plate, which includes the first region onto which the first part of the pattern has been exposed, in the direction parallel to the surface of the plate to arrange the first region below the second surface.

52. The exposure apparatus according to claim 50, wherein the second part of the pattern includes a dimension smaller than that of the first part of the pattern.

53. The exposure apparatus according to claim 50, wherein the plurality of light converging portions include at least one of a light converging light shield pattern, a phase diffraction pattern, and a lens surface.

54. The exposure apparatus according to claim 50, wherein the first gap and the second gap each are set within a value of 1 μm to 1000 μm.

55. A device manufacturing method comprising:
   an exposure step using the exposure method according to claim 46 to expose the pattern onto a photosensitive plate;
   a development step of developing the photosensitive plate on which the pattern has been transferred and forming on a surface of the photosensitive plate a mask layer including a shape corresponding to the pattern; and
   a processing step of processing the surface of the photosensitive plate by means of the mask layer.

56. A device manufacturing method comprising:
- an exposure step using the exposure apparatus according to claim 50 to expose the pattern onto a photosensitive plate;
- a development step of developing the photosensitive plate on which the pattern has been transferred and forming on a surface of the photosensitive plate a mask layer including a shape corresponding to the pattern; and
- a processing step of processing the surface of the photosensitive plate by means of the mask layer.

* * * * *